US012408462B2

(12) United States Patent
Kim et al.

(10) Patent No.: US 12,408,462 B2
(45) Date of Patent: Sep. 2, 2025

(54) IMAGE SENSOR AND METHOD OF MANUFACTURING THE SAME

(71) Applicant: Samsung Electronics Co., Ltd., Suwon-si (KR)

(72) Inventors: Chanhyung Kim, Seoul (KR); Gilwoo Kong, Hwaseong-si (KR); Jihee Yang, Suwon-si (KR); Khangjune Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 502 days.

(21) Appl. No.: 17/893,661

(22) Filed: Aug. 23, 2022

(65) Prior Publication Data

US 2023/0170369 A1 Jun. 1, 2023

(30) Foreign Application Priority Data

Nov. 29, 2021 (KR) .................. 10-2021-0167056

(51) Int. Cl.
*H10F 39/00* (2025.01)
*H10F 39/18* (2025.01)

(52) U.S. Cl.
CPC ......... *H10F 39/807* (2025.01); *H10F 39/011* (2025.01); *H10F 39/182* (2025.01);
(Continued)

(58) Field of Classification Search
None
See application file for complete search history.

(56) References Cited

U.S. PATENT DOCUMENTS

2015/0372036 A1 12/2015 Suh et al.
2016/0126271 A1 5/2016 Sakurano et al.
(Continued)

FOREIGN PATENT DOCUMENTS

KR 10-2015-0145934 12/2015
KR 10-2019-0139035 A 12/2019
(Continued)

OTHER PUBLICATIONS

Extended European Search Report dated Mar. 27, 2023 for corresponding European Application No. 22209832.9.

*Primary Examiner* — Benjamin P Sandvik
(74) *Attorney, Agent, or Firm* — Harness, Dickey & Pierce, P.L.C.

(57) ABSTRACT

An image sensor includes photoelectric conversion device regions in a substrate; and an isolation structure extending in a direction from a first surface of the substrate to a second surface opposing the first surface, surrounding the photoelectric conversion device regions in a plan view, and having first regions adjacent to side surfaces of the photoelectric conversion device regions and second regions adjacent to each corner of the photoelectric conversion device regions. The isolation structure includes first isolation layers surrounding the photoelectric conversion device regions, respectively, second isolation layers surrounding the first isolation layers, first gap-fill patterns filling at least a portion of a space between the second isolation layers in the first regions, and second gap-fill patterns filling at least a portion of a space between the second isolation layers in the second regions, in the plan view.

20 Claims, 32 Drawing Sheets

(52) U.S. Cl.
CPC ....... *H10F 39/805* (2025.01); *H10F 39/8053* (2025.01); *H10F 39/8063* (2025.01); *H10F 39/809* (2025.01)

(56) References Cited

U.S. PATENT DOCUMENTS

| | | | |
|---|---|---|---|
| 2017/0170229 | A1 | 6/2017 | Oh et al. |
| 2018/0286896 | A1* | 10/2018 | Kim ................ H10F 39/199 |
| 2019/0067356 | A1* | 2/2019 | Lin ................ H10F 39/182 |
| 2019/0378865 | A1 | 12/2019 | Zhang |
| 2020/0058687 | A1 | 2/2020 | Lee |
| 2020/0219911 | A1* | 7/2020 | Hur ................ H10F 39/802 |
| 2020/0219928 | A1 | 7/2020 | Park et al. |
| 2020/0227449 | A1 | 7/2020 | Kim et al. |
| 2020/0286937 | A1 | 9/2020 | Honda et al. |
| 2021/0118929 | A1* | 4/2021 | Yang ................ H10F 39/8057 |
| 2021/0143196 | A1 | 5/2021 | Uchida et al. |
| 2021/0193704 | A1 | 6/2021 | Sun |
| 2021/0193706 | A1 | 6/2021 | Kim et al. |
| 2021/0202547 | A1* | 7/2021 | Cho ................ H10F 39/014 |
| 2021/0327930 | A1* | 10/2021 | Lim ................ H10F 39/199 |

FOREIGN PATENT DOCUMENTS

| | | |
|---|---|---|
| KR | 10-2020-0085984 A | 7/2020 |
| KR | 10-2020-0087544 A | 7/2020 |

\* cited by examiner

IMAGE SENSOR AND METHOD OF MANUFACTURING THE SAME

CROSS-REFERENCE TO RELATED APPLICATION

This application claims benefit of priority to Korean Patent Application No. 10-2021-0167056 filed on Nov. 29, 2021 in the Korean Intellectual Property Office, the disclosure of which is incorporated herein by reference in its entirety.

BACKGROUND

Example embodiments of the present inventive concepts relate to image sensors and methods of manufacturing the same.

An image sensor capturing an image and converting the image into an electrical signal has been used in consumer electronic devices such as a digital camera, a mobile phone camera and a portable camcorder, and also in cameras mounted on automobiles, security devices, and robots. Since there has been demand for miniaturization and high resolution of such an image sensor, various studies have been conducted to meet the demand therefor.

SUMMARY

Some example embodiments of the present inventive concepts provide an image sensor in which dark current properties may be addressed and which may have improved optical property efficiency and improved sensitivity, and/or methods of manufacturing the same.

According to some example embodiments of the present inventive concepts, an image sensor may include a first chip structure including a first substrate and first circuit devices on the first substrate; and a second chip structure on the first chip structure. The second chip structure may include a second substrate having a first surface facing the first chip structure and a second surface opposing the first surface; second circuit devices on the first surface of the second substrate; anti-reflective layers on the second surface of the second substrate; color filters on the anti-reflective layers; microlenses on the color filters; an isolation structure in the second substrate; and photoelectric conversion device regions spaced apart from each other by the isolation structure in the second substrate. The isolation structure may have first regions adjacent to side surfaces of the photoelectric conversion device regions and second regions adjacent to each corner of the photoelectric conversion device regions. The isolation structure may include first isolation layers surrounding the photoelectric conversion device regions, respectively, second isolation layers surrounding the first isolation layers, first gap-fill patterns filling at least a portion of a space between the second isolation layers in the first regions, and second gap-fill patterns filling at least a portion of a space between the second isolation layers in the second regions, in a plan view, and wherein the second gap-fill patterns are in contact with the first gap-fill patterns, in the plan view.

According to some example embodiments of the present inventive concepts, an image sensor may include photoelectric conversion device regions in a substrate; and an isolation structure extending in a direction from a first surface of the substrate to a second surface opposing the first surface, surrounding the photoelectric conversion device regions in a plan view, and having first regions adjacent to side surfaces of the photoelectric conversion device regions and second regions adjacent to each corner of the photoelectric conversion device regions, wherein the isolation structure includes first isolation layers surrounding the photoelectric conversion device regions, respectively, second isolation layers surrounding the first isolation layers, first gap-fill patterns filling at least a portion of a space between the second isolation layers in the first regions, and second gap-fill patterns filling at least a portion of a space between the second isolation layers in the second regions, in the plan view.

According to some example embodiments of the present inventive concepts, an image sensor may include a photoelectric conversion device region in a substrate; and an isolation structure extending in a direction from a first surface of the substrate to a second surface opposing the first surface, and surrounding the photoelectric conversion device region, wherein the isolation structure includes a first isolation layer surrounding the photoelectric conversion device region, a second isolation layer surrounding the first isolation layer, first gap-fill patterns in contact with the second isolation layer, and second gap-fill patterns in contact with the second isolation layer in a region adjacent to each corner of the photoelectric conversion device region, in a plan view, and wherein the second gap-fill patterns are spaced apart from each other by the first gap-fill patterns.

According to some example embodiments of the present inventive concepts, a method of manufacturing an image sensor includes forming an isolation trench having line regions and cross regions based on etching a substrate; forming a first isolation layer in the isolation trench; forming a second isolation layer on the first isolation layer in the isolation trench; forming a first gap-fill material layer on the second isolation layer, where the first gap-fill material layer fills the isolation trench in the line regions, and the first gap-fill material layer partially fills the isolation trench in the cross regions; forming first gap-fill patterns in the line regions based on etching the first gap-fill material layer and exposing the second isolation layer in the cross regions; forming a second gap-fill material layer filling the isolation trench in the cross regions and in contact with the second isolation layer; forming second gap-fill patterns in the cross regions by etching the second gap-fill material layer; and forming a capping layer on the first gap-fill patterns and the second gap-fill patterns.

According to some example embodiments of the present inventive concepts, a method of manufacturing an image sensor forming a first structure including a first substrate, a first circuit device on the first substrate, a first wiring structure on the first circuit device, and a first insulating layer covering the first wiring structure; forming a second structure including a second substrate, photoelectric conversion device regions in the second substrate, an isolation structure extending in a direction from a first surface of the second substrate to a second surface opposing the first surface, a second circuit device on a first surface of the second substrate, a second wiring structure, and a second insulating layer covering the second wiring structure; and bonding the first structure to the second structure such that the first insulating layer are in direct contact with to the second insulating layer, wherein the forming the isolation structure includes forming an isolation trench having line regions and cross regions and semiconductor patterns spaced apart from each other by the isolation trench by etching the second substrate; forming a plurality of layers within the isolation trench; forming first gap-fill patterns filling the isolation trench in the line regions; and forming second gap-fill patterns filling the isolation trench and in contact with the first gap-fill patterns in the cross regions.

BRIEF DESCRIPTION OF DRAWINGS

The above and other aspects, features, and advantages of the present inventive concepts will be more clearly understood from the following detailed description, taken in combination with the accompanying drawings, in which.

DETAILED DESCRIPTION

Figure 1A:
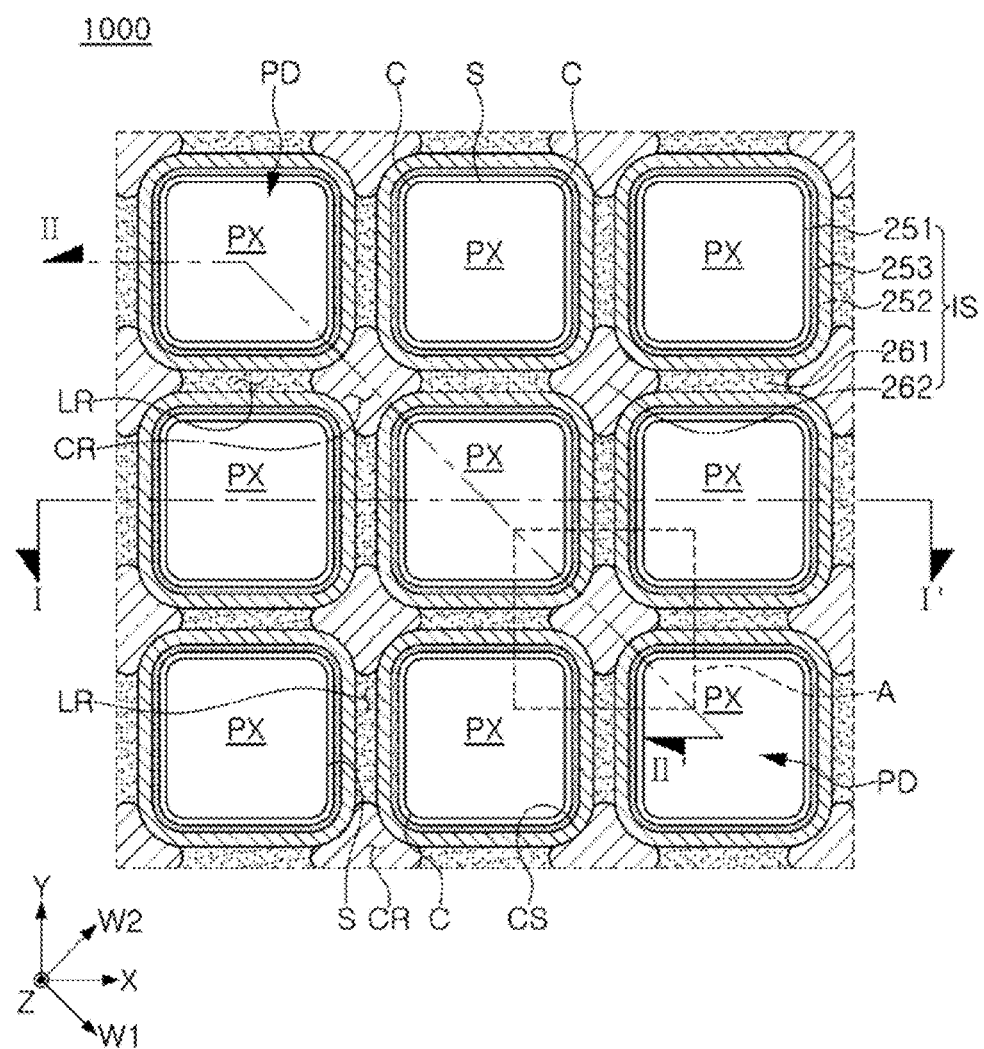
FIG. 1A is a diagram illustrating an image sensor according to some example embodiments of the present inventive concepts.

Hereinafter, some example embodiments of the present inventive concepts will be described as follows with reference to the accompanying drawings.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

While the term "same," "equal" or "identical" may be used in description of some example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

As described herein, when an operation is described to be performed "by" performing additional operations, it will be understood that the operation may be performed "based on" the additional operations, which may include performing said additional operations alone or in combination with other further additional operations.

Elements that are described herein to be in "contact" with one or more other elements or with each other may be interchangeably referred to as being in "direct contact" with the one or more other elements or with each other. Elements that are described herein to be spaced apart from each other may be interchangeably referred to as being "isolated from direct contact with each other."

FIG. 1A is a diagram illustrating an image sensor, an enlarged diagram illustrating a portion of an image sensor, according to some example embodiments.

Figure 1B:
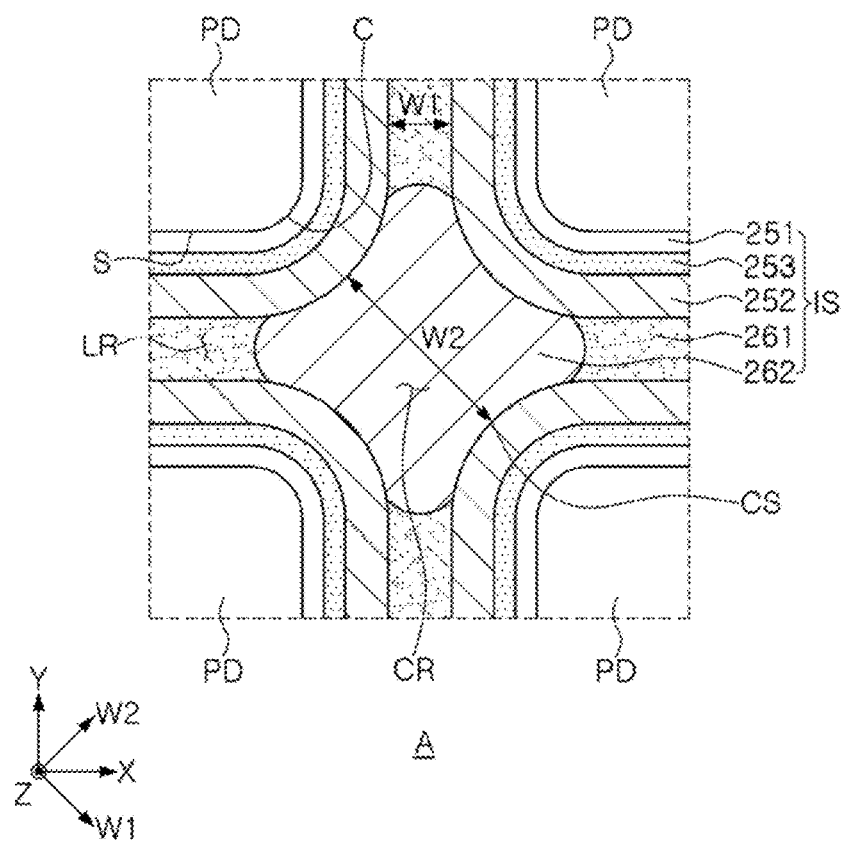
FIG. 1B is an enlarged diagram illustrating a region of an image sensor including an isolation structure according to some example embodiments of the present inventive concepts.

FIG. 1B is an enlarged diagram illustrating a region of an image sensor including an isolation structure, illustrating region "A" of the image sensor in FIG. 1A, according to some example embodiments.

Figure 2A:
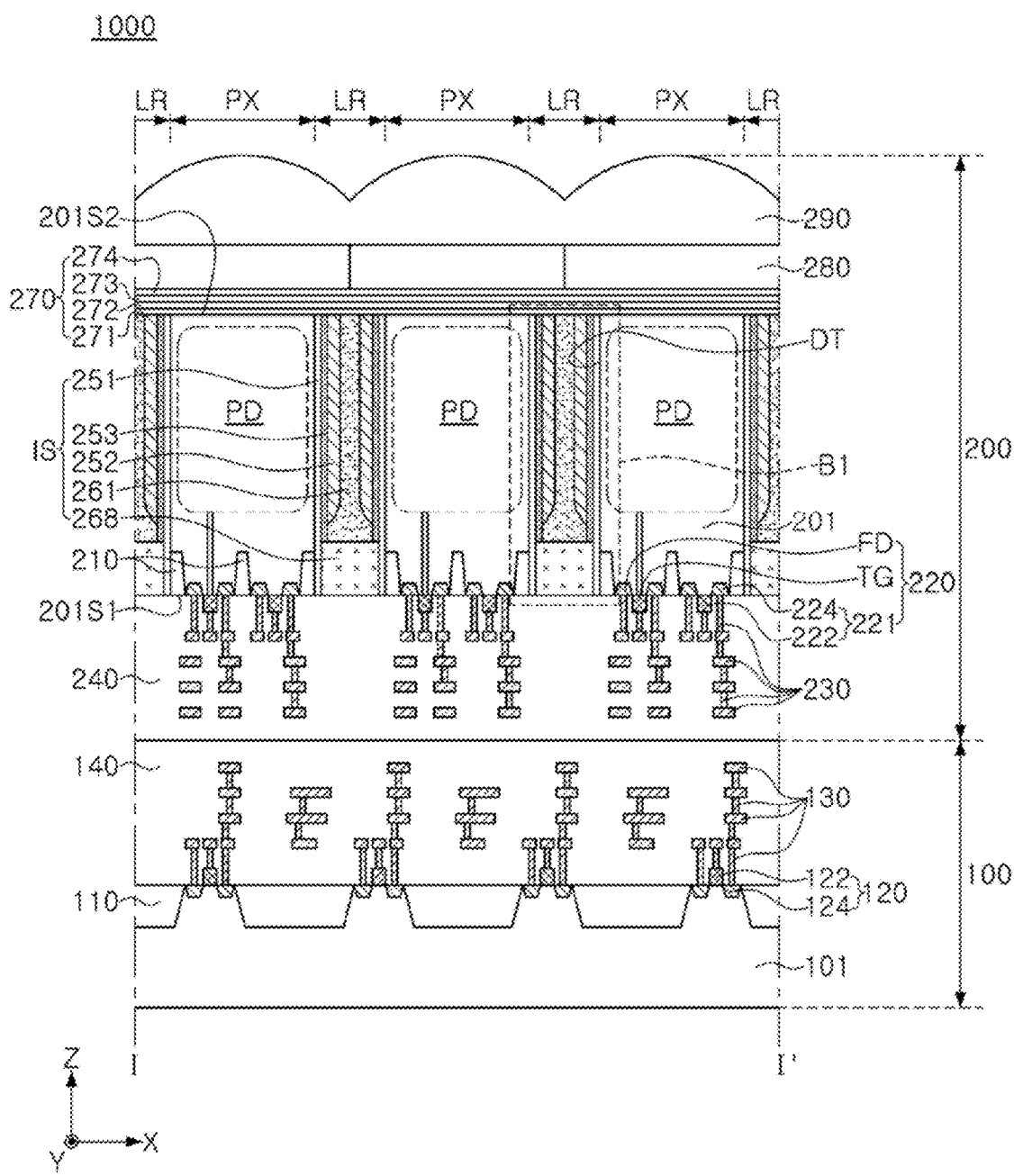
FIGS. 2A and 2B are cross-sectional diagrams illustrating an image sensor according to some example embodiments of the present inventive concepts.
Figure 2B:
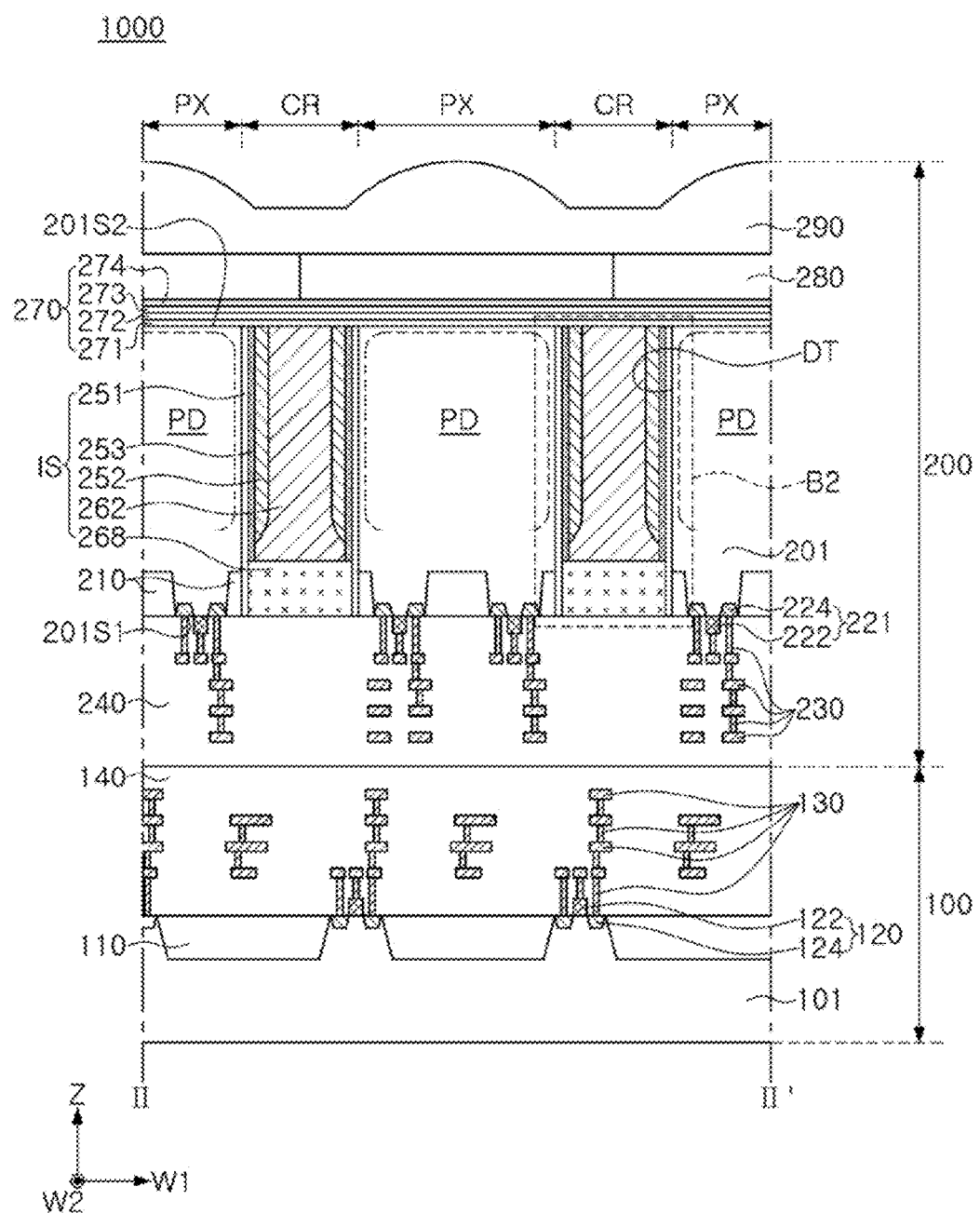

FIGS. 2A and 2B are cross-sectional diagrams illustrating an image sensor according to some example embodiments. FIG. 2A is a cross-sectional diagram illustrating an image sensor taken along line I-I' in FIG. 1A. FIG. 2B is a cross-sectional diagram illustrating an image sensor taken along line II-II' in FIG. 1A.

Figure 2C:
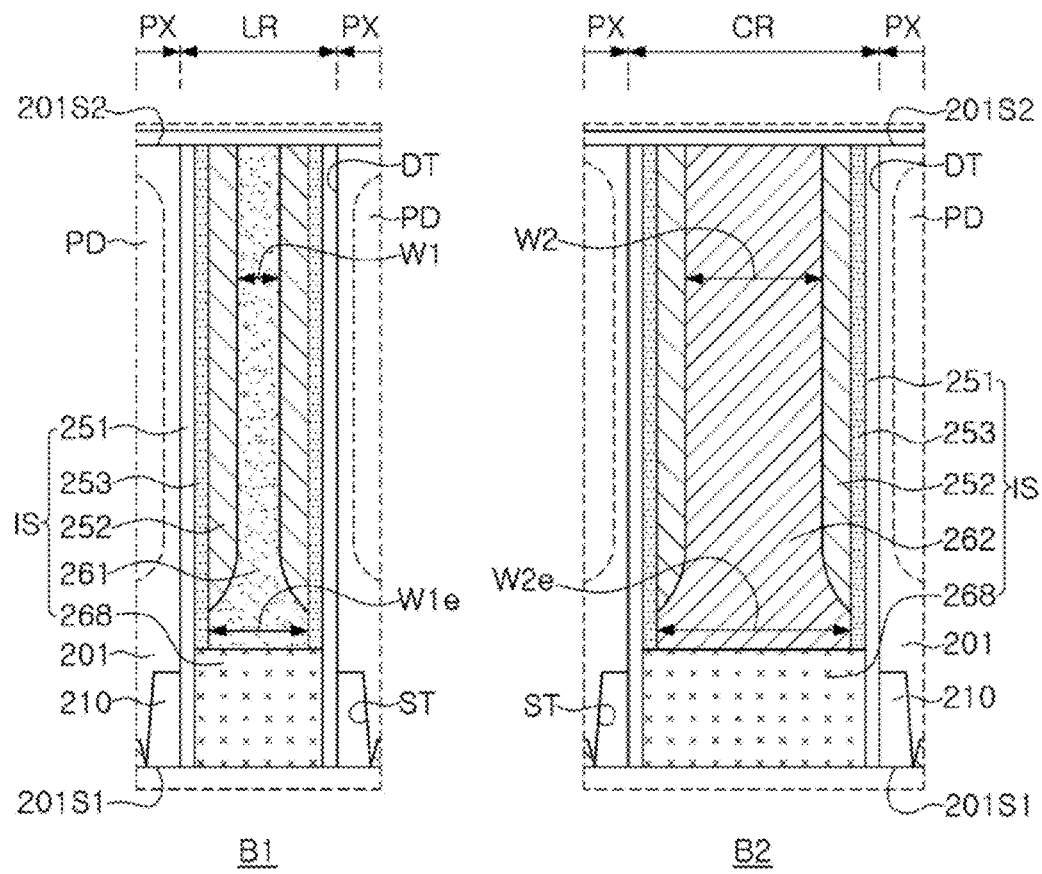
FIG. 2C is an enlarged diagram illustrating a region of an image sensor including an isolation structure according to some example embodiments of the present inventive concepts.

FIG. 2C is an enlarged diagram illustrating a region of an image sensor including an isolation structure according to some example embodiments. FIG. 2C illustrates region "B1" in FIG. 2A and region "B2" in FIG. 2B.

Referring to FIGS. 1A to 2B, an image sensor 1000 in some example embodiments may include a first chip structure 100 and a second chip structure 200. The second chip structure 200 may be disposed on the first chip structure 100. The first chip structure 100 may be configured as a logic chip, and the second chip structure 200 may be configured as an image sensor chip including a plurality of pixel regions PX. In some example embodiments, the first chip structure 100 may be configured as a stack chip structure including a logic chip and a memory chip.

The first chip structure 100 may include a first substrate 101, a first device isolation layer 110 defining an active region on the first substrate 101, a first circuit device 120 on the first substrate 101, and a first wiring structure 130 and a first insulating layer 140 on the first circuit device 120.

The first substrate 101 may include a semiconductor material, such as, for example, a group IV semiconductor, a group III-V compound semiconductor, or a group II-VI compound semiconductor. The first circuit device 120 may include a device such as a transistor including a gate 122 and a source/drain 124. The first insulating layer 140 may cover the first circuit device 120 and the first wiring structure 130 on the first substrate 101, and may include a plurality of insulating layers. For example, the first insulating layer 140 may be configured as multiple layers including at least two of a silicon oxide layer, a low dielectric layer, or a silicon nitride layer.

The second chip structure 200 may include a second substrate 201 having a first surface 201S1 and a second surface 201S2 opposing each other, a second device isolation layer 210 disposed on the first surface 201S1 of the second substrate 201 and defining an active region, a second circuit device 220, a second wiring structure 230, and a second insulating layer 240 disposed between the first surface 201S1 of the second substrate 201 and the first chip structure 100, photoelectric conversion device regions PD in the second substrate 201, an isolation structure IS penetrating the second substrate 201 and surrounding the photoelectric conversion device regions PD, an insulating structure 270 disposed on the second surface 201S2 of the second substrate 201, color filters 280 on the insulating structure 270, and microlenses 290 on the color filters 280.

The second substrate 201 may include a semiconductor material, such as, for example, a group IV semiconductor, a group III-V compound semiconductor, or a group II-VI compound semiconductor. For example, the second substrate 201 may be configured as a single crystal silicon substrate.

The second device isolation layer 210 may be formed by, for example, a shallow trench isolation (STI) process. The second device isolation layer 210 may partially extend from the first surface 201S1 of the second substrate 201 into the second substrate 201. The second device isolation layer 210 may be formed of an insulating material, such as, for example, silicon oxide, silicon nitride, silicon oxynitride, or any combination thereof.

The second circuit device 220 may include a transfer gate TG, a floating diffusion region FD, and circuit transistors 221. The circuit transistor 221 may include a gate 222 and a source/drain 224. The transfer gate TG may transfer electric charges from an adjacent photoelectric conversion device region PD to an adjacent floating diffusion region FD. The circuit transistor 221 may be configured as at least one of a source follower transistor, a reset transistor, or a select transistor. The transfer gate TG may be configured as a vertical transfer gate including a portion extending from the first surface 201S1 of the second substrate 201 into the second substrate 201.

The second wiring structure 230 may include multiple wirings disposed in layers on different levels and vias electrically connecting the multiple wirings and electrically connecting the multiple wirings to the second circuit device 220.

The second insulating layer 240 may cover the second circuit device 220 and the second wiring structure 230 below the first surface 201S1 of the second substrate 201, and may include a plurality of insulating layers. For example, the second insulating layer 240 may be formed as multiple layers including at least two of a silicon oxide layer, a low dielectric layer, or a silicon nitride layer. The second insulating layer 240 may be in contact with and bonded to the first insulating layer 140.

The photoelectric conversion device regions PD may be formed in the second substrate 201 and may be spaced apart from each other by the isolation structure IS. The pixel regions PX may be defined as regions including the photoelectric conversion device regions PD. For example, each of the pixel regions PX may include a photoelectric conversion device region PD. The photoelectric conversion device region PD may generate and accumulate electric charges corresponding to incident light. For example, the photoelectric conversion device region PD may include a photodiode, a phototransistor, a photogate, a pinned photodiode (PPD), or any combination thereof.

The isolation structure IS may be disposed to surround the pixel regions PX including each of the photoelectric conversion device regions PD. The isolation structure IS may be disposed in the isolation trench DT penetrating through the second substrate 201. The isolation structure IS may be formed in a direction from the first surface 201S1 of the second substrate 201 to the second surface 201S2 opposing the first surface 201S1. For example, at least a portion of the isolation structure IS may penetrate the second substrate 201. In another example, the isolation structure IS may be disposed to partially penetrate the second substrate 201 rather than completely penetrating the second substrate 201. The isolation structure IS may be connected to a portion of the second device isolation layer 210. For example, the isolation structure IS may penetrate the second device isolation layer 210.

As illustrated in FIGS. 1A and 1B, the isolation structure IS may include first regions LR adjacent to side surfaces S of the photoelectric conversion device regions PD and second regions CR adjacent to each corner C of the photoelectric conversion device regions PD. The second regions CR may be intersecting regions of a grid pattern of the isolation structure IS in a plan view, and may include, for example, regions in which patterns extending in the X-direction intersect with patterns extending in the Y-direction.

In a plan view, the isolation structure IS may include first isolation layers 251 and second isolation layers 252 surrounding the photoelectric conversion device regions PD, respectively. The first isolation layers 251 may surround the photoelectric conversion device regions PD, respectively, and the second isolation layers 252 may surround the first isolation layers 251, respectively. The first isolation layers 251 and the second isolation layers 252 may extend from the first regions LR to the second regions CR, and may include a rounded portion surrounding each corner of the photoelectric conversion device regions PD in the second regions CR.

The isolation structure IS may further include first gap-fill patterns 261 filling at least a portion of a space between the second isolation layers 252 in the first regions LR and second gap-fill patterns 262 filling at least a portion of a space between the second isolation layers 252 in the second regions CR. The second gap-fill patterns 262 may be in contact with the first gap-fill patterns 261. The second gap-fill patterns 262 may be disposed adjacent to each corner of the plurality of photoelectric conversion device regions PD, and may be spaced apart from each other by the first gap-fill patterns 261. The first gap-fill patterns 261 may be disposed between adjacent photoelectric conversion device regions PD in a first direction (X-direction or Y-direction) in a plan view, and the second gap-fill patterns 262 may be disposed between the photoelectric conversion device regions PD adjacent to each other in a second direction (W1 direction or W2 direction) oblique to the first direction and parallel to the second surface 201S2 of the second substrate 201 in a plan view. The first gap-fill patterns 261 may have a first minimum width W1 in the first direction (X-direction or Y-direction), the second gap-fill patterns 262 may have a second minimum width W2 in the second direction (W1 direction or W2 direction), and the first minimum width W1 may be smaller than the second minimum width W2. For example, the second minimum width W2 may be about 1.3 times to about 4 times, or about 1.8 times to about 2.2 times the first minimum width W1. The first gap-fill pattern 261 may include a first portion having a first minimum width W1 and a second portion having a width W1$e$ greater than the first minimum width W1, and the second gap-fill pattern 262 may include a first portion having a second minimum width W2 and a width W2$e$ greater than the second minimum width W2.

The second gap-fill patterns 262 may have a cross shape in a plan view. Side surfaces of the second gap-fill patterns 262 in contact with the first gap-fill patterns 261 may be curved surfaces, curved toward the first gap-fill patterns 261. Surfaces of a first element that are herein described to be curved "toward" another element may be "convex" surfaces of the first element. The second gap-fill patterns 262 may include a concave region CS facing a portion of each corner C of the photoelectric conversion device region PD in a plan view. The concave region CS may be in contact with the second isolation layer 252.

The isolation structure IS may include liner layers 253 disposed between the first isolation layers 251 and the second isolation layers 252 and a capping layer 268 covering first gap-fill patterns 261 and second gap-fill patterns 262 between the first isolation layers 251. The liner layers 253 may surround the first isolation layers 251 in a plan view, respectively. The liner layers 253 may be formed of silicon oxide, silicon nitride, silicon oxynitride, or any combination thereof. The first isolation layers 251 may extend longer toward the first surface 201S1 of the second substrate 201 than the second isolation layers 252 and the liner layers 253, and may be in contact with the capping layer 268. The capping layer 268 may be formed of silicon oxide, silicon nitride, silicon oxynitride, or any combination thereof.

For example, the second gap-fill patterns 262 may include a material different from a material of the first gap-fill patterns 261, and may include the same material as a material of the second isolation layers 252. For example, the first isolation layers 251 may include a material different from a material of the second isolation layers 252. The liner layers 253 may include a material different from a material of the first isolation layers 251 and the second isolation layers 252. The first isolation layer 251 may be formed of an insulating material, such as, for example, silicon oxide, silicon nitride, silicon oxynitride, or any combination thereof. The second isolation layer 252 may include a semiconductor material, such as, for example, polysilicon doped with n-type or p-type impurities or undoped polysilicon. The first gap-fill pattern 261 may be formed of an insulating material, such as, for example, silicon oxide, silicon nitride, silicon oxynitride, or any combination thereof. The second gap-fill pattern 262 may include a semiconductor material, such as, for example, polysilicon doped with n-type or p-type impurities or undoped polysilicon. N-type impurities may include at least one of phosphorus (P), arsenic (As), bismuth (Bi), or antimony (Sb), and p-type impurities may include at least one of boron (B), indium (In), or gallium (Ga).

Differently from the above example, each of the first and second isolation layers 251 and 252 and the first and second gap-fill patterns 261 and 262 forming the isolation structure IS may include a conductive material, such as, for example, at least one of titanium nitride (TiN), tantalum nitride (TaN), tungsten nitride (WN), titanium (Ti), tungsten (W), aluminum (Al), or copper (Cu).

Each of the first isolation layer 251, the second isolation layer 252, the liner layer 253, the first gap-fill pattern 261, and the second gap-fill pattern 262 may be exaggerated in the diagrams to indicate the structure of the isolation structure IS of the image sensor 1000, and each component may have a thickness relatively reduced as compared to the illustrated example. The second isolation layer 252 may have a thickness greater than that of the first isolation layer 251, but some example embodiments thereof is not limited thereto, and thicknesses of the components included in the isolation structure IS may be the same or different.

In some example embodiments, a negative voltage may be applied to the second gap-fill pattern 262. A negative voltage may be applied to the second isolation layer 252 in contact with the second gap-fill pattern 262 through the second gap-fill pattern 262. Positive charges generated by the photoelectric conversion device region PD may be removed through the second isolation layer 252 surrounding the photoelectric conversion device region PD, thereby potentially reducing the dark current that may be generated in the image sensor 1000 and which may otherwise degrade quality of images generated based on electrical signals generated by the image sensor 1000. Accordingly, dark current properties of the image sensor may improve (e.g., the image sensor 1000 may be configured to have reduced dark current therein, thereby the image sensor 1000 may have improved image generating performance due to the reduction of dark current) based on the second gap-fill pattern 262 being in contact with the second isolation layer 252.

For example, the second gap-fill pattern 262 includes a polysilicon layer, and the polysilicon layer is used as a material layer gap-filling the entire internal space of the isolation trench DT between the second isolation layers 252, a portion of incident light may be absorbed by the polysilicon layer instead of the photoelectric conversion device region PD, such that optical property efficiency may degrade. In some example embodiments, a first gap-fill pattern 261 may be formed as a gap-fill material layer in the first regions LR, and a second gap-fill pattern 262 may be formed as a gap-fill material layer in the second regions CR. The second gap-fill pattern 262 may be locally disposed to be adjacent to a corner of the photoelectric conversion device region PD (e.g., based on the second gap-fill pattern 262 filling at least a portion of a space between the second isolation layers in the second region CR where the second region CR is adjacent to a corner of the photoelectric conversion device region PD, such that absorption of a portion of incident light by the polysilicon layer may be reduced, and thus optical property efficiency of the image sensor 1000 may be improved such that performance of the image sensor 1000 may be improved due to reduction of such absorption, based on the second gap-fill pattern 262 being adjacent to the corner of the photoelectric conversion device region PD.

That is, since the second gap-fill pattern 262 in the second region CR is in contact with the second isolation layer 252, an electrical connection path through which a negative voltage may be applied to the second isolation layer 252 may be provided, such that dark current properties of the image sensor may be addressed, and by locally or intermittently disposing the second gap-fill pattern 262 in the second region CR, the optical property efficiency and sensitivity of the image sensor may improve.

The insulating structure 270 may cover the second substrate 201 and the isolation structure IS. The insulating structure 270 may include an anti-reflective layer configured to allow incident light to travel to the photoelectric conversion device regions PD with high transmittance by adjusting a refractive index. The insulating structure 270 may include a plurality of insulating layers stacked in sequence. For example, the insulating structure 270 may include a first layer 271, a second layer 272, a third layer 273, and a fourth layer 274 stacked in sequence. The first to fourth layers 271, 272, 273, and 274 may include at least one of aluminum oxide, hafnium oxide, silicon oxynitride, silicon oxide, or silicon nitride.

The color filters 280 may allow light of a specific wavelength to transmit and to reach the photoelectric conversion device regions PD. For example, the color filters 280 may be formed of a material in which a pigment including a metal or a metal oxide is mixed with a resin. The color filters 280 may include a green filter, a red filter, and a blue filter. In example embodiments, the color filters 280 may not be provided, and the image sensor 1000 may include an organic photoelectric conversion film provided together with the color filters 280 or replacing the color filters 280.

The microlenses 290 may overlap each of the photoelectric conversion device regions PD in the vertical direction (Z). The microlenses 290 may be convex in a direction away from the second substrate 201 to condense incident light. The microlenses 290 may condense incident light into the photoelectric conversion device regions PD. The microlenses 290 may be formed of a transparent photoresist material or a transparent thermosetting resin material. For example, the microlenses 290 may be formed of a TMR-based vertical (manufactured by Tokyo Ohka Kogo, Co.) or an MFR-based resin (manufactured by Japan Synthetic Rubber Corporation), but some example embodiments thereof is not limited thereto.

Figure 3:
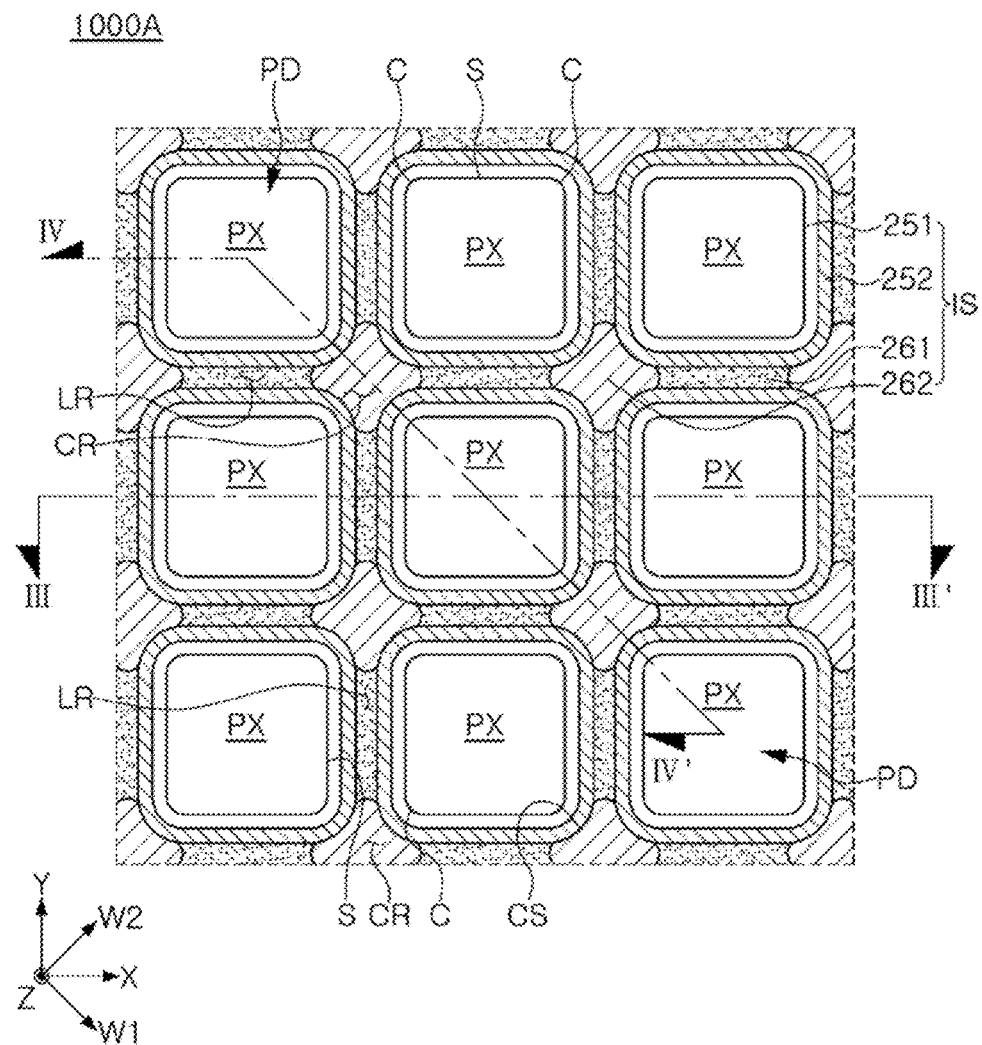
FIG. 3 is a plan diagram illustrating an image sensor according to some example embodiments of the present inventive concepts.

FIG. 3 is a plan diagram illustrating an image sensor according to some example embodiments.

Figure 4A:
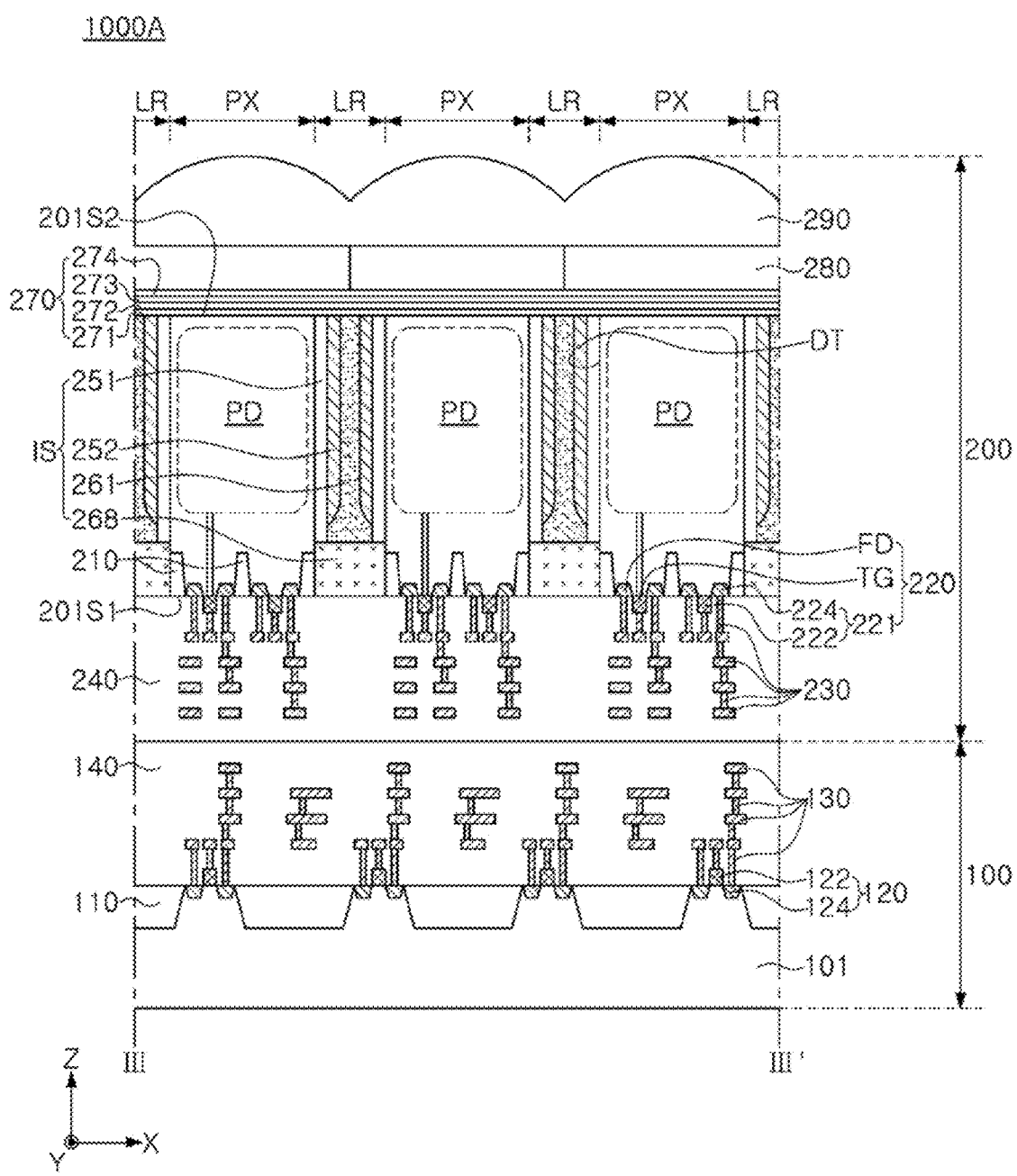
FIGS. 4A and 4B are cross-sectional diagrams illustrating an image sensor according to some example embodiments of the present inventive concepts.
Figure 4B:
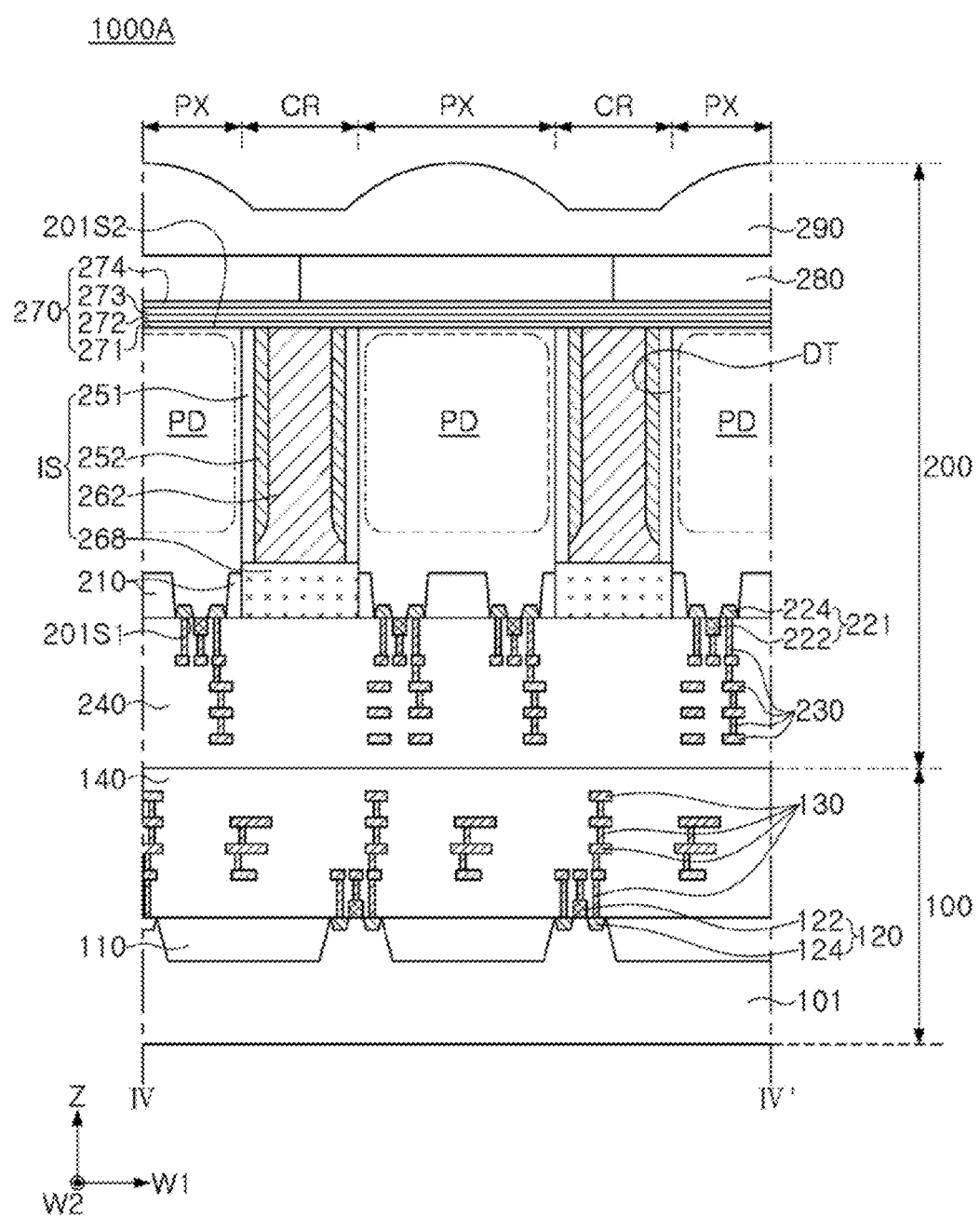

FIGS. 4A and 4B are cross-sectional diagrams illustrating an image sensor according to some example embodiments. FIG. 4A illustrates a cross-sectional diagram illustrating the image sensor in FIG. 3 taken along line III-III' and FIG. 4B illustrates a cross-sectional diagram illustrating the image sensor in FIG. 3 taken along line IV-IV'.

Referring to FIGS. 3 to 4B, in the second chip structure 200 of an image sensor 1000A in some example embodiments, the isolation structure IS may not include the liner layers 253. The second isolation layer 252 may surround the first isolation layer 251 and may be in direct contact with the first isolation layer 251. Each of the first gap-fill patterns 261 and the second gap-fill patterns 262 may include a portion in contact with the first isolation layer 251.

FIGS. 5A, 5B, 5C, 5D, 5E, and 5F are enlarged diagrams illustrating a region of an image sensor including an isolation structure according to some example embodiments. FIGS. 5A to 5F are enlarged diagrams illustrating regions corresponding to regions "B1" and "B2" in FIG. 2C, respectively.

Figure 5A:
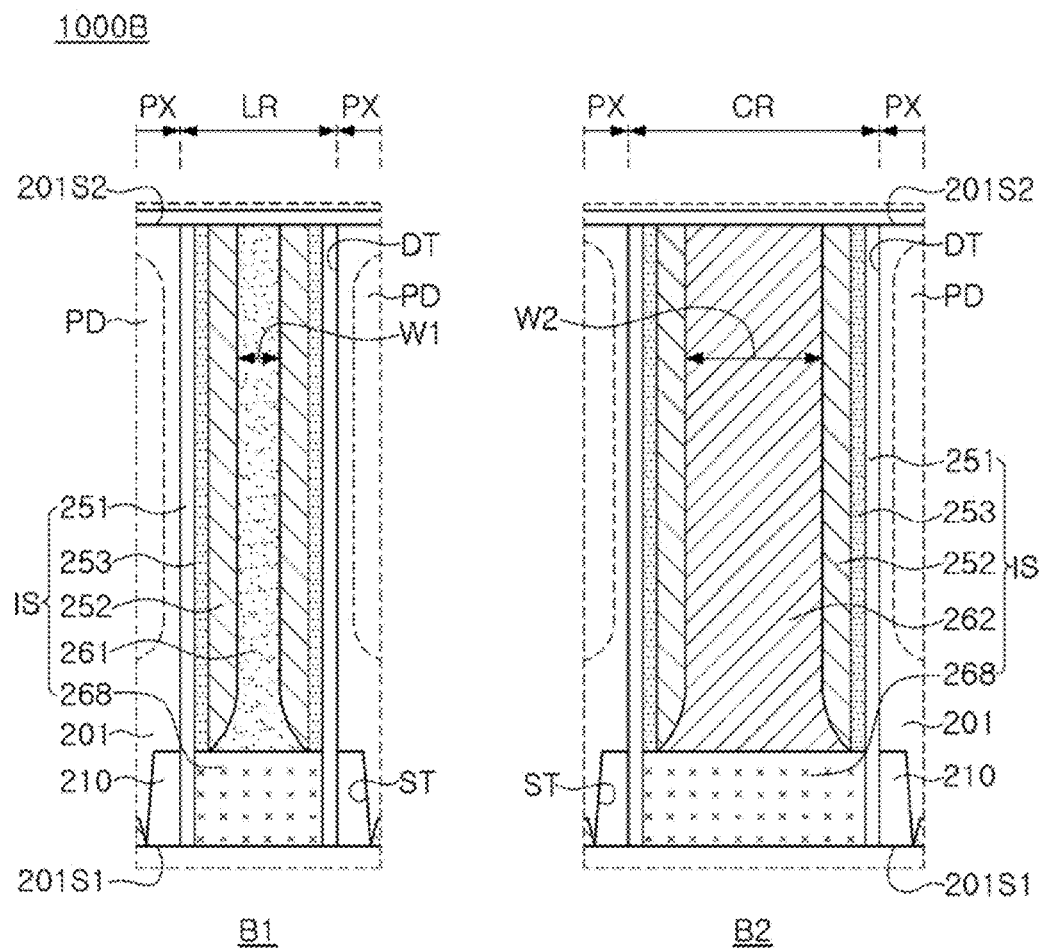
FIGS. 5A, 5B, 5C, 5D, 5E, and 5F are enlarged diagrams illustrating a region of an image sensor including an isolation structure according to some example embodiments of the present inventive concepts.

Referring to FIG. 5A, in an image sensor 1000B, with reference to the first surface 201S1 of the second substrate 201, the lower surface of the first gap-fill pattern 261 and the lower surface of the second gap-fill pattern 262 may be disposed lower than in some example embodiments, including the example embodiments shown in FIG. 2C. For example, the lower surface of the first gap-fill pattern 261 and the lower surface of the second gap-fill pattern 262 may be disposed on a level lower than the level in some example embodiments, including the example embodiments shown in FIG. 2C. For example, the lower surface of the first gap-fill pattern 261 and the lower surface of the second gap-fill pattern 262 may be disposed on the same level as a level of the upper surface of the second device isolation layer 210 in the second substrate 201. However, some example embodiments thereof is not limited thereto, and the lower surface of the first gap-fill pattern 261 and the lower surface of the second gap-fill pattern 262 may be disposed on a level higher than a level of the upper surface of the second device isolation layer 210 in the second substrate 201. Alternatively, the lower surface of the first gap-fill pattern 261 may be disposed on a level different from a level of the lower surface of the second gap-fill pattern 262.

Figure 5B:
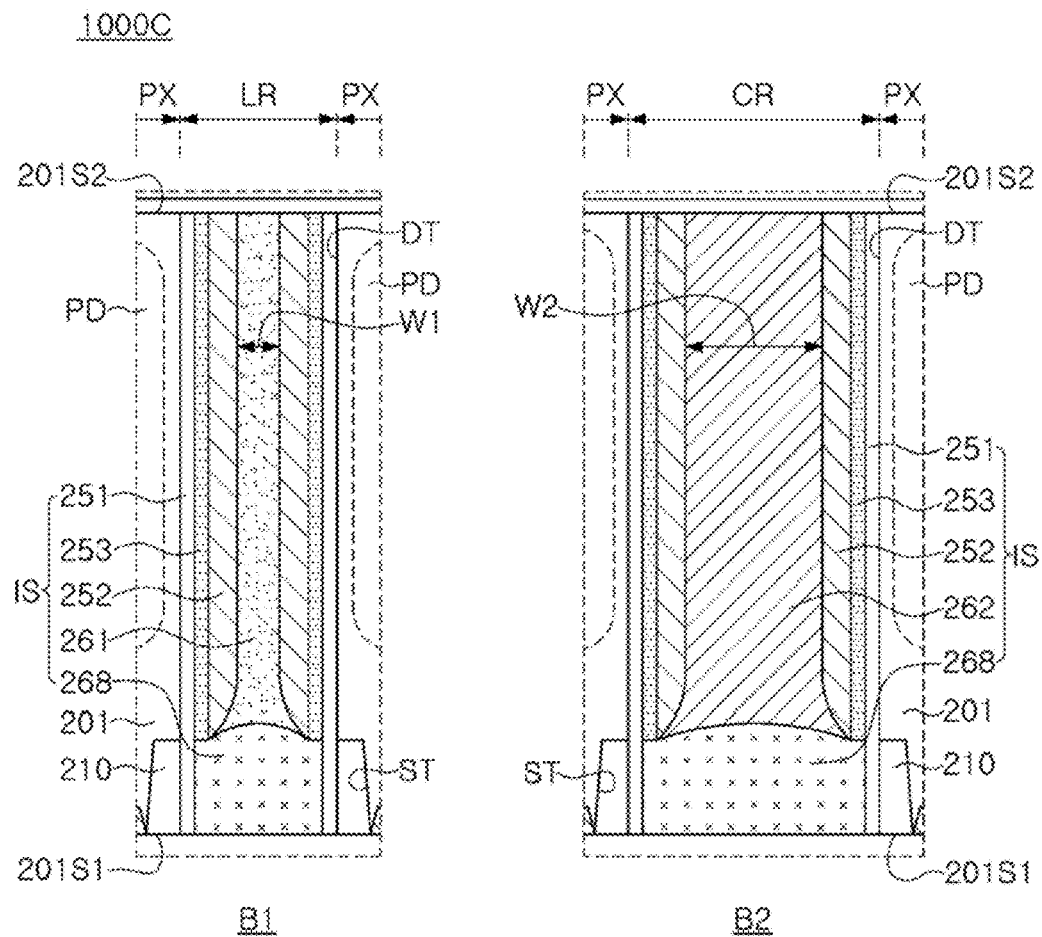

Referring to FIG. 5B, in an image sensor 1000C, with reference to the first surface 201S1 of the second substrate 201, each of the lower surface of the first gap-fill pattern 261 and the lower surface of the second gap-fill pattern 262 may have a concave lower surface. The shape of the lower surface of the first gap-fill pattern 261 may be formed in the process of etching the first gap-fill pattern 261, and the shape of the lower surface of the second gap-fill pattern 262 may be formed the process of etching the second gap-fill pattern 262, and each shape may be varied in example embodiments.

Figure 5C:
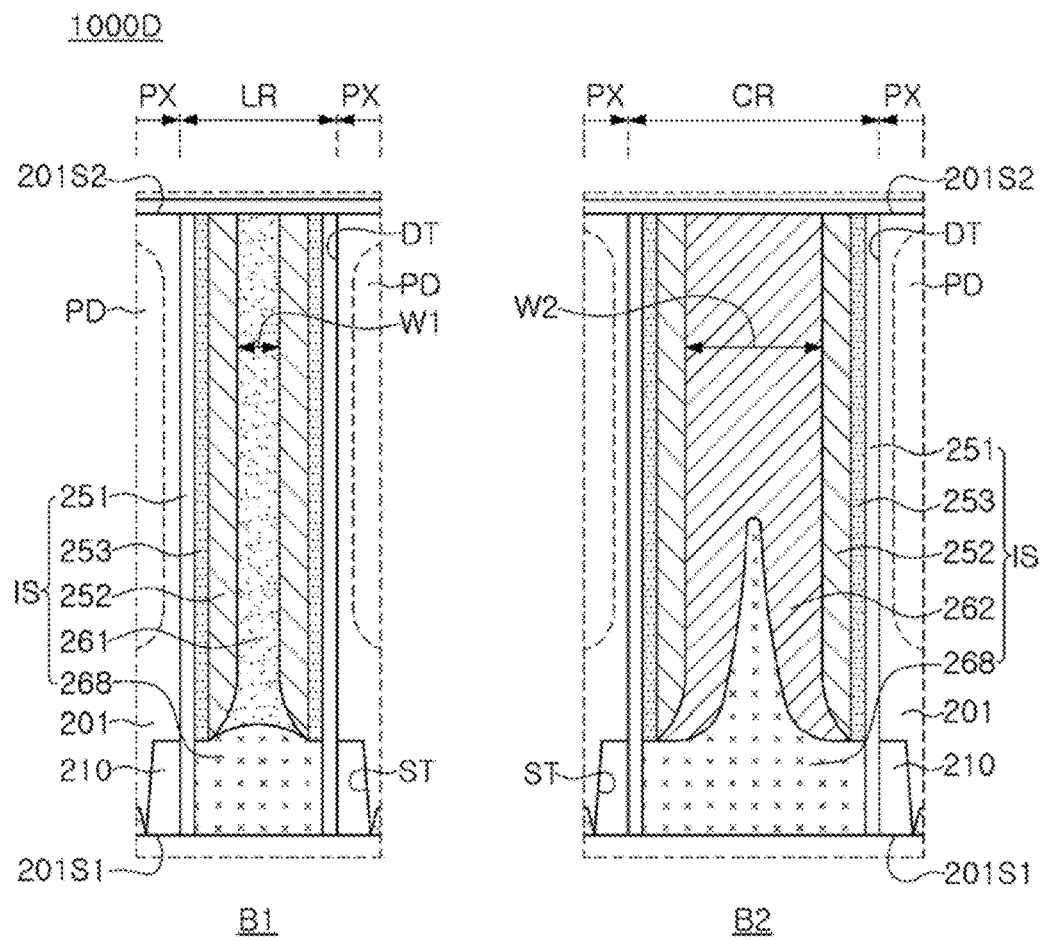

Referring to FIG. 5C, in an image sensor 1000D, each of the lower surface of the first gap-fill pattern 261 and the lower surface of the second gap-fill pattern 262 may have a concave lower surface, and a lower surface of the second gap-fill pattern 262 may provide a relatively deep recess with respect to the first surface 201S1 of the second substrate 201. The recess may extend to a region between internal side surfaces of the second isolation layers 252 facing each other, and an upper end thereof may be disposed on a level lower than or on the same level as a level of an upper surface of the second gap-fill pattern 262.

Figure 5D:
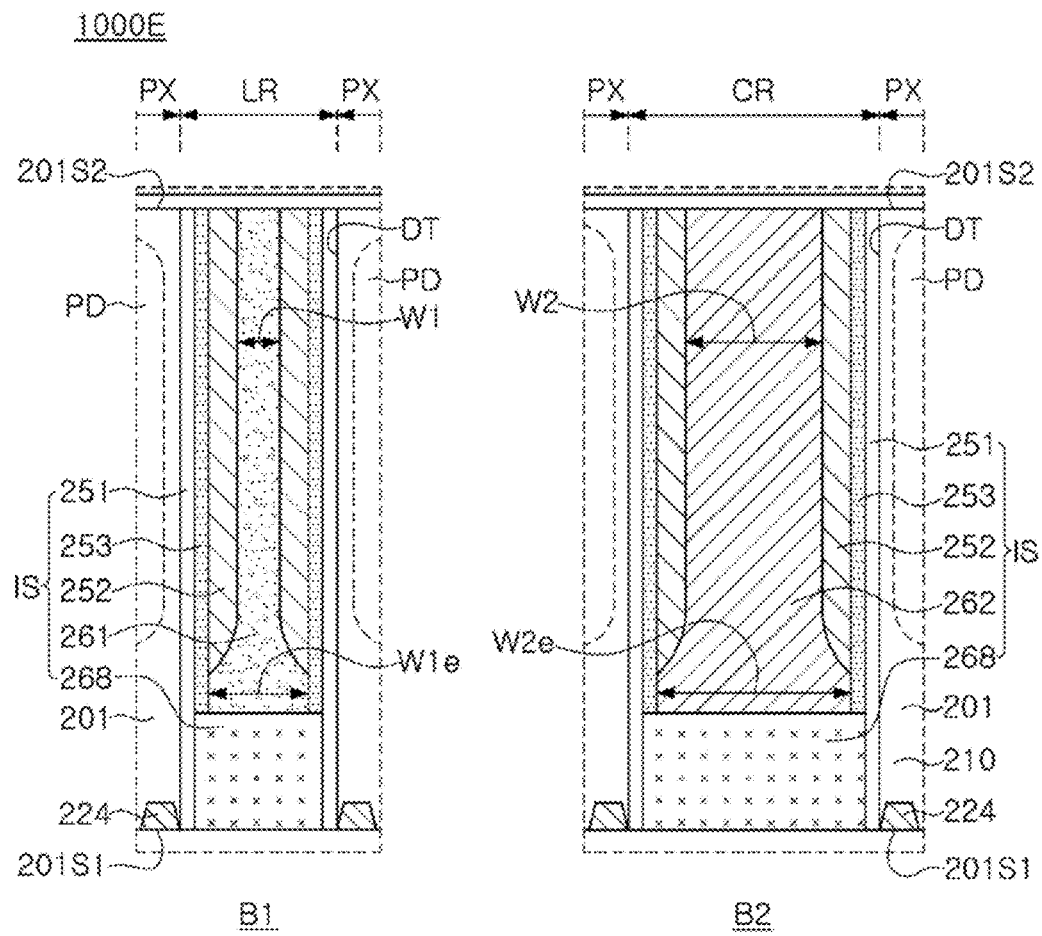

Referring to FIG. 5D, the image sensor 1000E may not include the second device isolation layer 210 through which the isolation structure IS penetrates. The isolation structure IS may work as an isolation layer defining an active region between the second circuit devices 220.

Figure 5E:
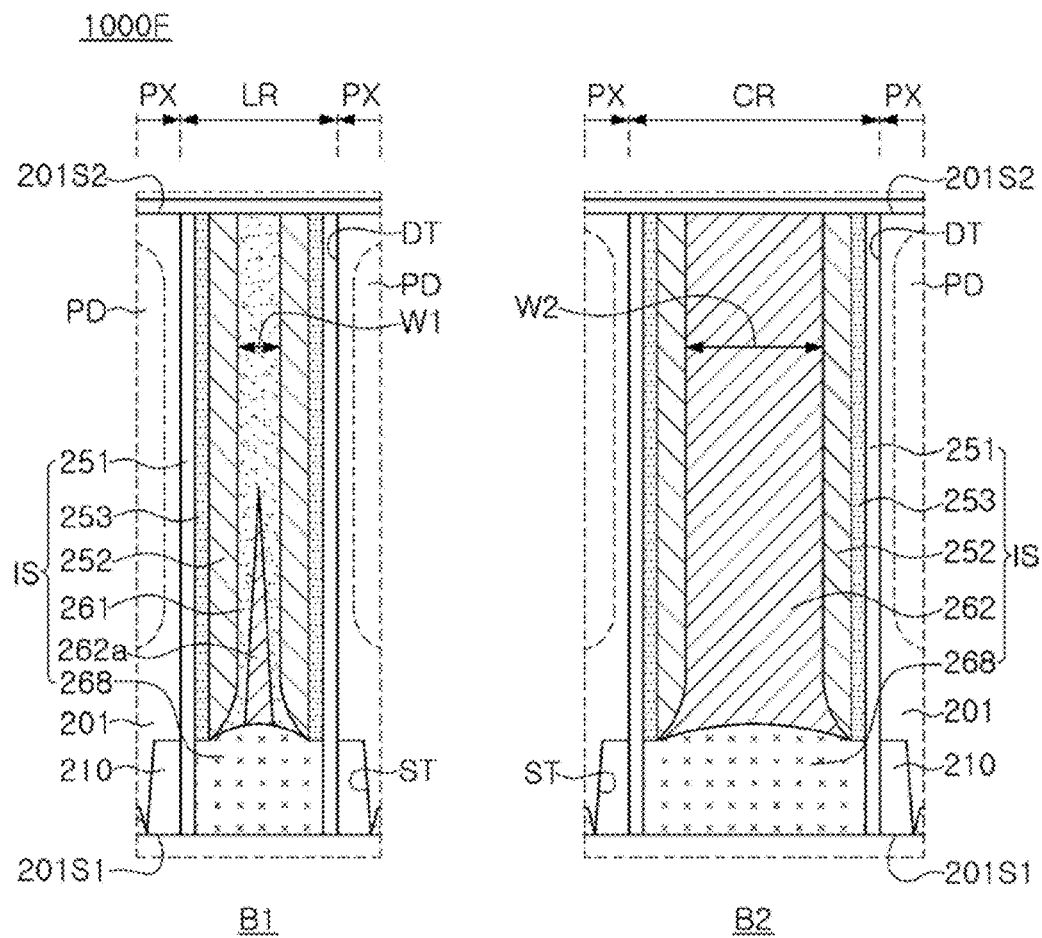

Referring to FIG. 5E, in an image sensor 1000F, a portion 262a of the second gap-fill pattern 262 of the isolation structure IS may extend in a direction from the capping layer 268 toward an upper end of the first gap-fill pattern 261 in the first gap-fill pattern 261 in the first regions LR. In the first regions LR, when the first gap-fill material layer 261' (FIG. 9B) does not completely fill the isolation trench DT such that a seam is formed therein, a recess having a predetermined depth may be formed in the first gap-fill pattern 261 in the process (FIG. 9C) of etching the first gap-fill material layer 261'. A portion 262a of the second gap-fill pattern 262 may be formed by filling the recess with the second gap-fill material layer 262' when the second gap-fill material layer 262' (FIG. 9D) is formed. The portion 262a of the second gap-fill pattern 262 in the first regions LR may not be in contact the second isolation layer 252 and may have a shape of which a width decreases toward the second surface 201S2 of the second substrate 201. For example, the portion 262a of the second gap-fill pattern 262 may have a pointy shape toward the second surface 201S2 of the second substrate 201.

Figure 5F:
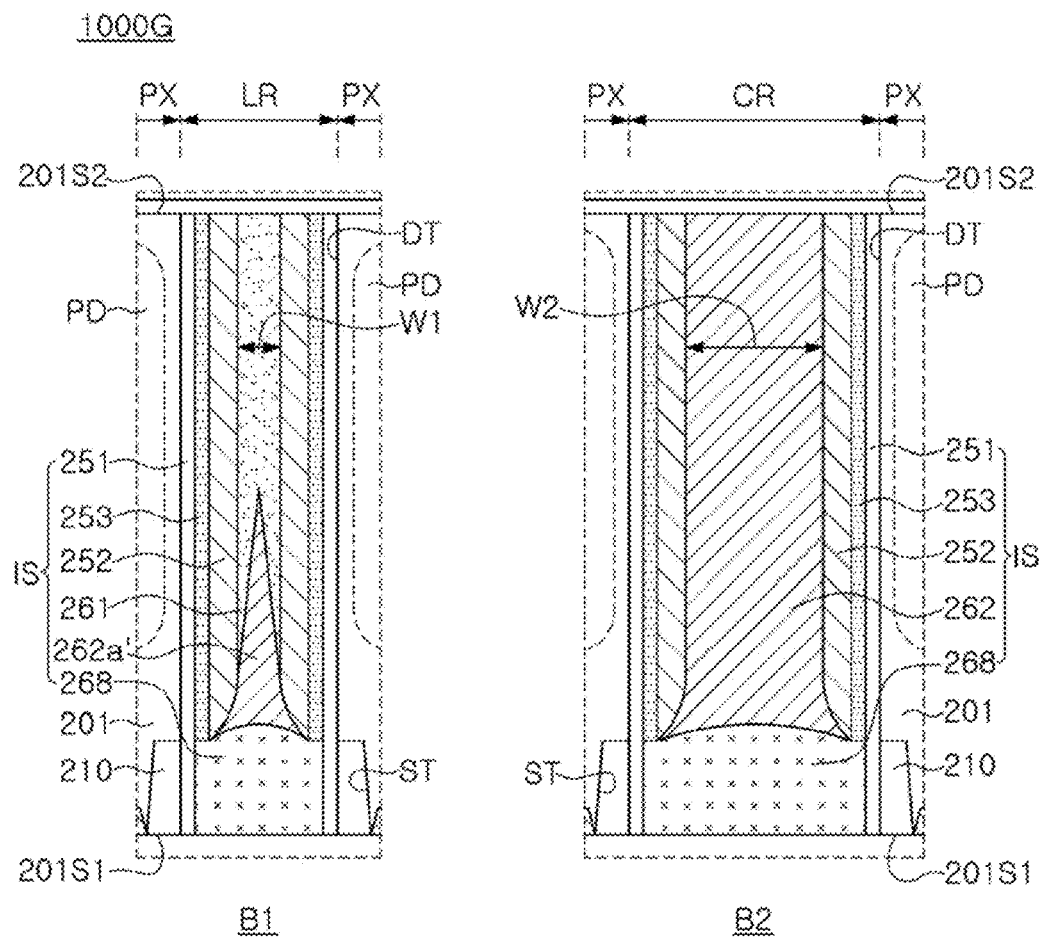

Referring to FIG. 5F, in an image sensor 1000G, similarly to the image sensor in FIG. 5E, a portion 262a' of the second gap-fill pattern 262 of the isolation structure IS may extend in a direction from the capping layer 268 toward an upper end of the first gap-fill pattern 261 in the first gap-fill pattern 261 in the first regions LR, and the portion 262a' of the second gap-fill pattern 262 may be in contact with the second isolation layer 252. In some example embodiments, including the example embodiments shown in FIG. 5F, the etching of the first gap-fill material layer 261' may be performed more excessively in the first regions LR than in some example embodiments, including the example embodiments shown in FIG. 5E.

Figure 6:
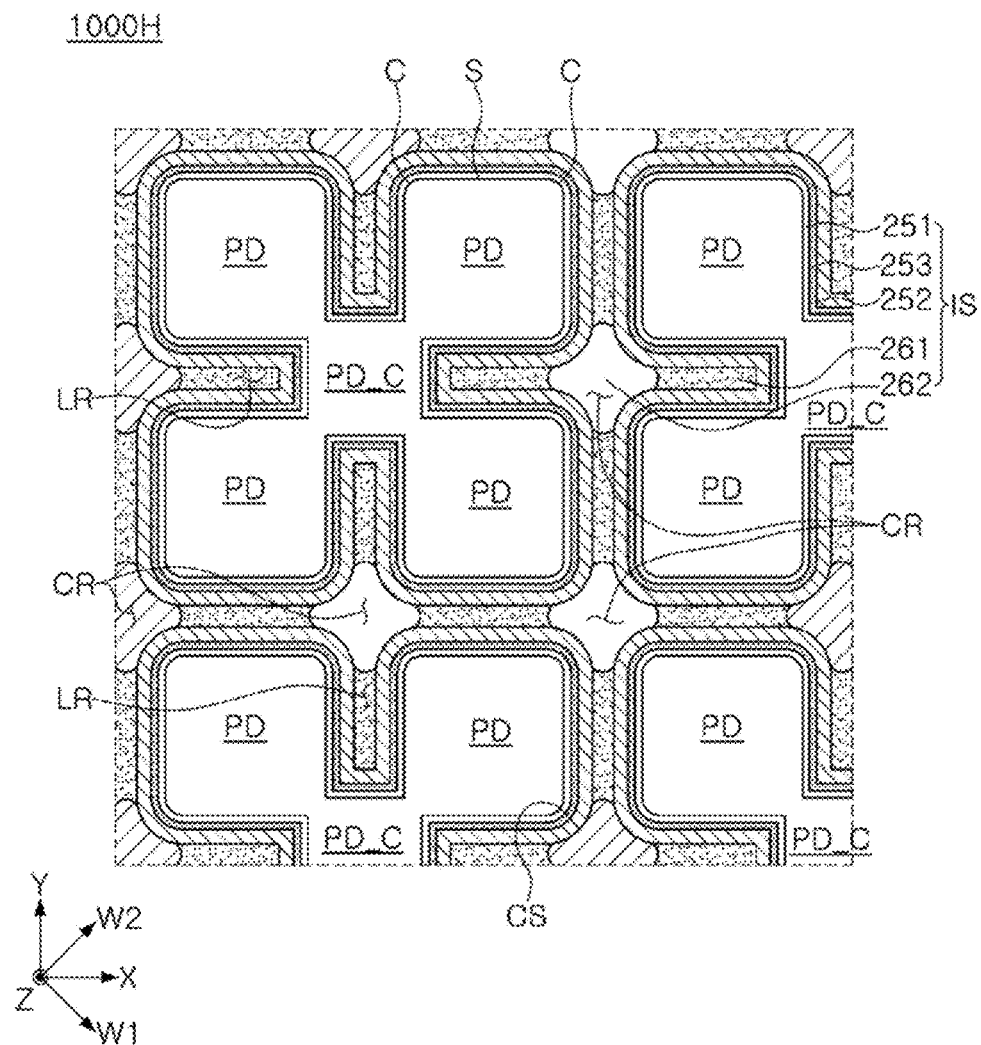
FIG. 6 is a plan diagram illustrating an image sensor according to some example embodiments of the present inventive concepts.

FIG. 6 is a plan diagram illustrating an image sensor according to some example embodiments.

Referring to FIG. 6, the image sensor 1000H may include a second chip structure 200 including pixel regions PX configured in a Q-cell pattern, and for example, the four photoelectric conversion device regions PD adjacent to each other may share a single microlens 290, and the connection region PD_C connecting the four photoelectric conversion device regions PD adjacent to each other to each other may be disposed in a central region of the four photoelectric conversion device regions PD. Accordingly, a dynamic range of the image sensor 1000F may be improved or optimized. By intermittently disposing the second gap-fill pattern 262 in each region adjacent to corners of the four photoelectric conversion device regions PD, optical property efficiency and sensitivity of the image sensor may improve.

Figure 7:
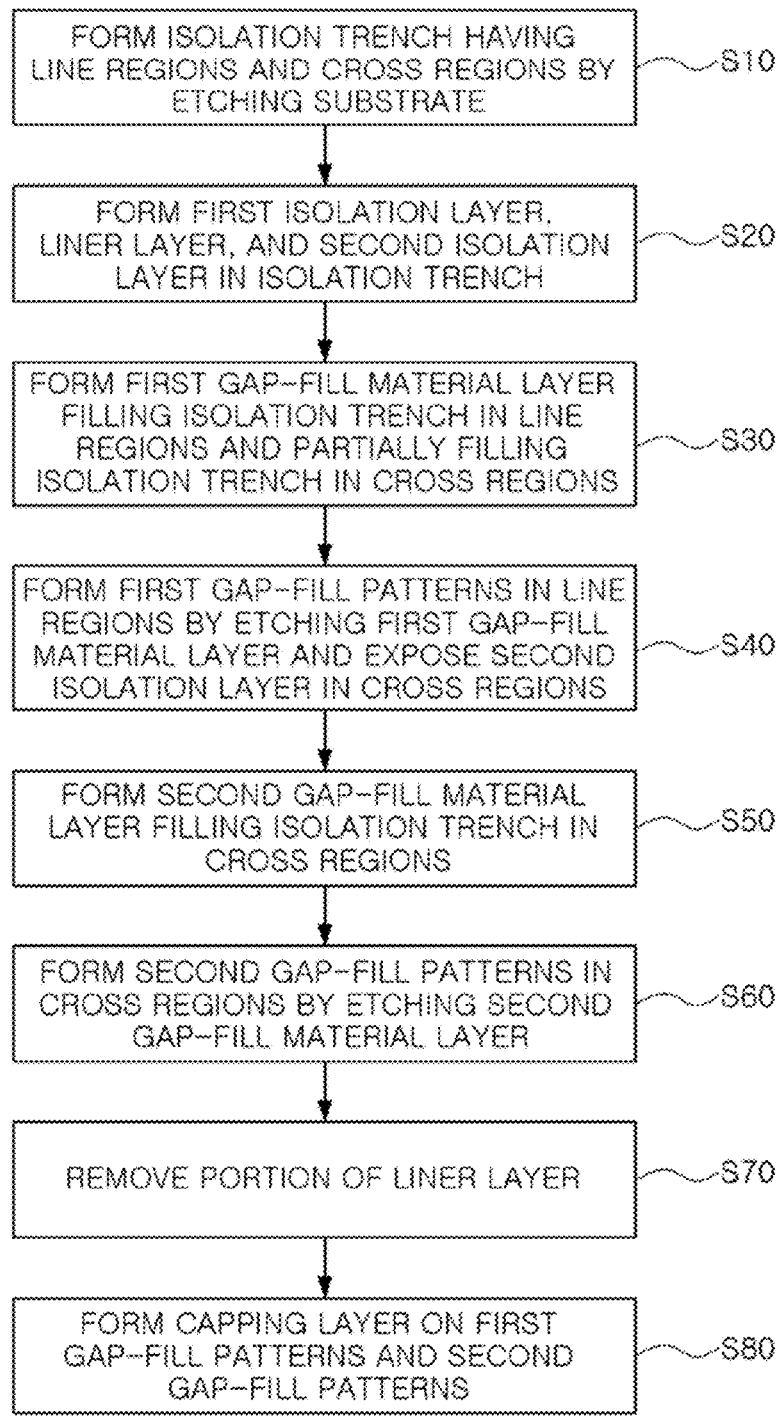
FIG. 7 is a flowchart illustrating processes of a method of manufacturing an image sensor in order according to some example embodiments of the present inventive concepts.

FIG. 7 is a flowchart illustrating processes of a method of manufacturing an image sensor in order according to some example embodiments.

Figure 8:
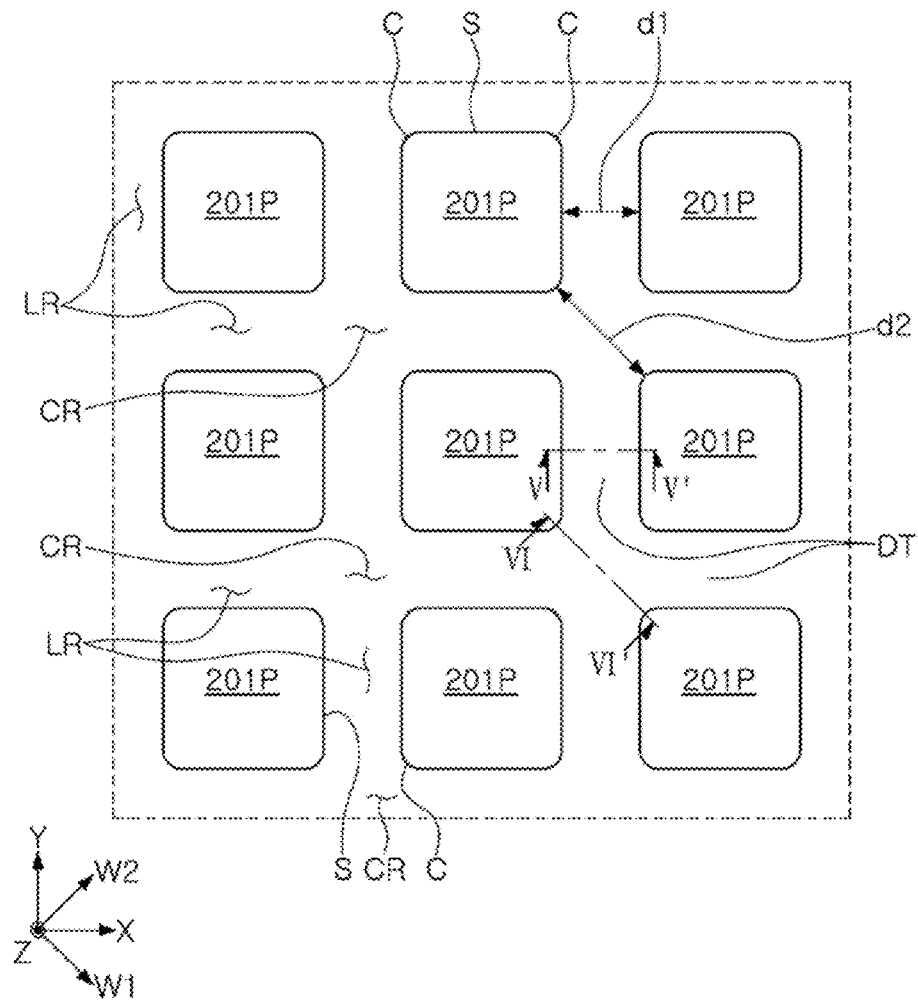
FIG. 8 is a diagram illustrating a substrate on which an isolation trench is formed in relation to a method of manufacturing an image sensor in order according to some example embodiments of the present inventive concepts.

FIG. 8 is a diagram illustrating a substrate on which an isolation trench is formed in relation to a method of manufacturing an image sensor in order according to some example embodiments.

FIGS. 9A, 9B, 9C, 9D, 9E, 9F, and 9G are diagrams illustrating processes of a method of manufacturing an image sensor in order according to some example embodiments. FIGS. 9A to 9G illustrate cross-sectional regions of the substrate taken long lines V-V' and VI-VI' in FIG. 8.

FIGS. 10A, 10B, 11A, and 11B are diagrams illustrating processes of a method of manufacturing an image sensor in order according to some example embodiments.

Figure 9A:
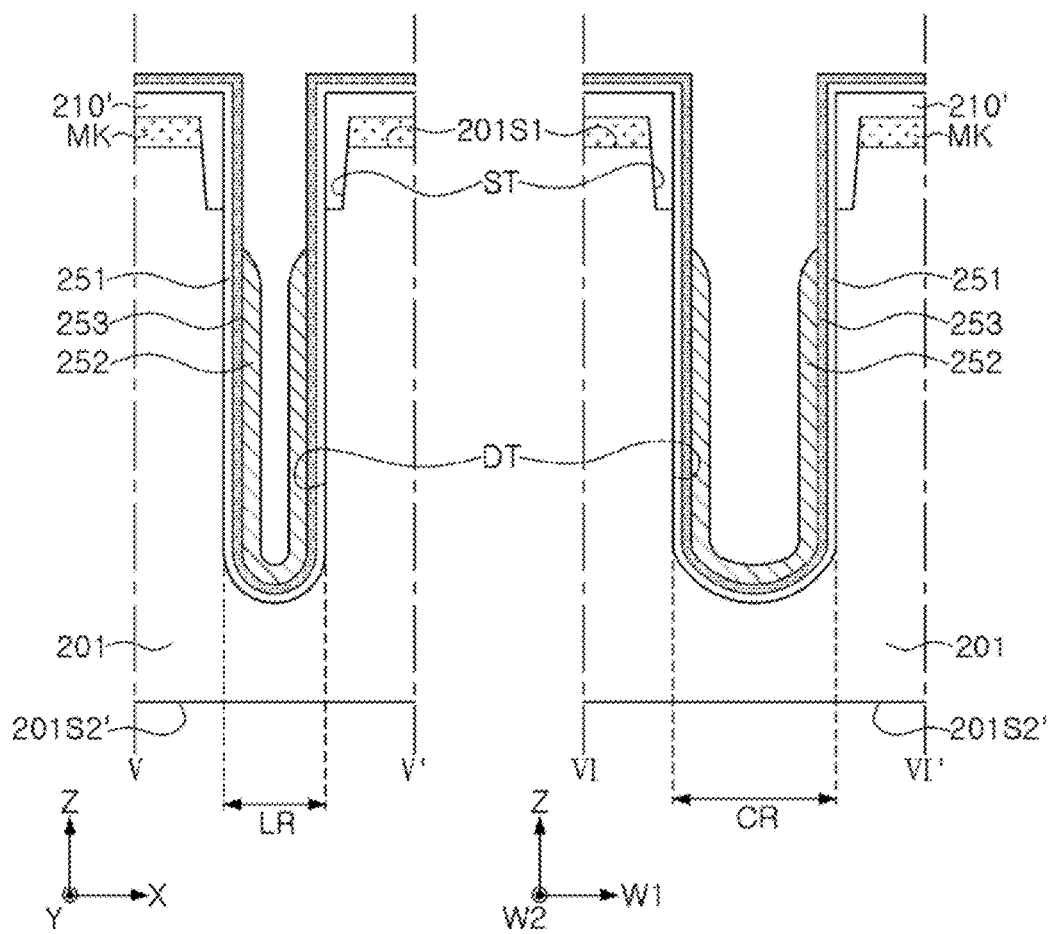
FIGS. 9A, 9B, 9C, 9D, 9E, 9F, and 9G are diagrams illustrating processes of a method of manufacturing an image sensor in order according to some example embodiments of the present inventive concepts.

Referring to FIGS. 7, 8, and 9A, an isolation trench DT having line regions LR and cross regions CR may be formed by etching the second substrate 201 (S10), and a first isolation layer 251, a liner layer 253, and a second isolation layer 252 may be formed in the isolation trench DT (S20).

A second substrate 201 may be prepared, a mask pattern MK may be formed on the first surface 201S1 of the second substrate 201, an etching process may be performed on the second substrate 201 using the mask pattern MK, a shallow isolation trench ST may be formed, and a device isolation layer 210' may be formed in the shallow isolation trench ST. The device isolation layer 210' may completely fill the shallow isolation trench ST and may cover the mask pattern MK. The upper surface of the device isolation layer 210' may be formed on a level higher than a level of the first surface 201S1 of the second substrate 201.

Thereafter, a mask (not illustrated) may be formed on the device isolation layer 210', and the isolation trench DT may be formed by anisotropically etching the device isolation layer 220' and the second substrate 201. As illustrated in FIG. 9, the isolation trench DT may be formed in the form of a grid pattern. For example, the isolation trench DT may include first line patterns extending in the X-direction and second lines extending in the Y-direction. The isolation trench DT may include line regions LR having a line shape in a plan view and cross regions CR including regions in which the first and second line patterns intersect with each other. By the isolation trench DT, as illustrated in FIG. 8, semiconductor patterns 201P arranged in a matrix form in the X- and Y-directions on the second substrate 201 and spaced apart from each other by the isolation trench DT may be formed. The first distance d1 between the side surfaces S of the semiconductor patterns 201P in the line regions LR may be less than a second distance d2 between the corners C of the semiconductor patterns 201P in the cross regions CR.

Thereafter, a first isolation layer 251 conformally covering an internal side surface and a bottom surface of the isolation trench DT may be formed in the isolation trench DT, a liner layer 253 may be formed on the first isolation layer 251 in the isolation trench DT, and the second isolation layer 252 may be formed on the liner layer 253 in the isolation trench DT. In example embodiments, the forming the liner layer 253 may not be performed, and in this case, the second isolation layer 252 may be formed on the first isolation layer 251. The second isolation layer 252 may be formed on the isolation trench DT and may be recessed to a level lower than a level of the lower surface of the shallow isolation trench ST by an etching process. The upper side surface of the second isolation layer 252 may be inclined toward an internal wall of the isolation trench DT, but some example embodiments thereof is not limited thereto.

Figure 9B:
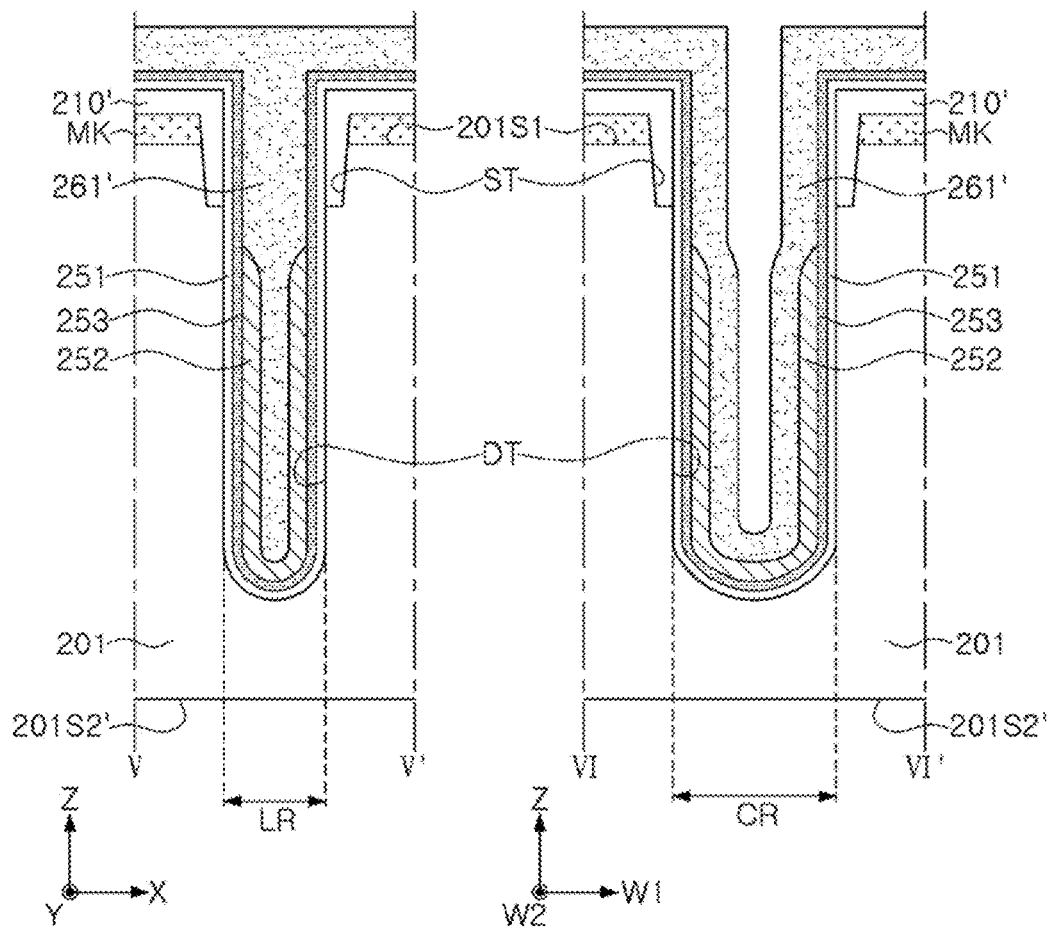

Referring to FIGS. 7 and 9B, the first gap-fill material layer 261' filling the isolation trench DT in the line regions LR and partially filling the isolation trench DT in the cross regions CR' may be formed (S30).

The first gap-fill material layer 261' may completely fill the isolation trench DT in the line regions LR and may extend to the isolation trench DT. Since the space between the semiconductor patterns 201P is wider in the cross regions CR than in the line regions LR, the first gap-fill material layer 261' may partially fill the isolation trench DT in the cross regions CR. For example, the first gap-fill material layer 261' may not completely gap-fill the isolation trench DT in the cross regions CR. The first gap-fill material layer 261' may conformally cover the second isolation layer 252 and the liner layer 253 in the cross regions CR.

Figure 9C:
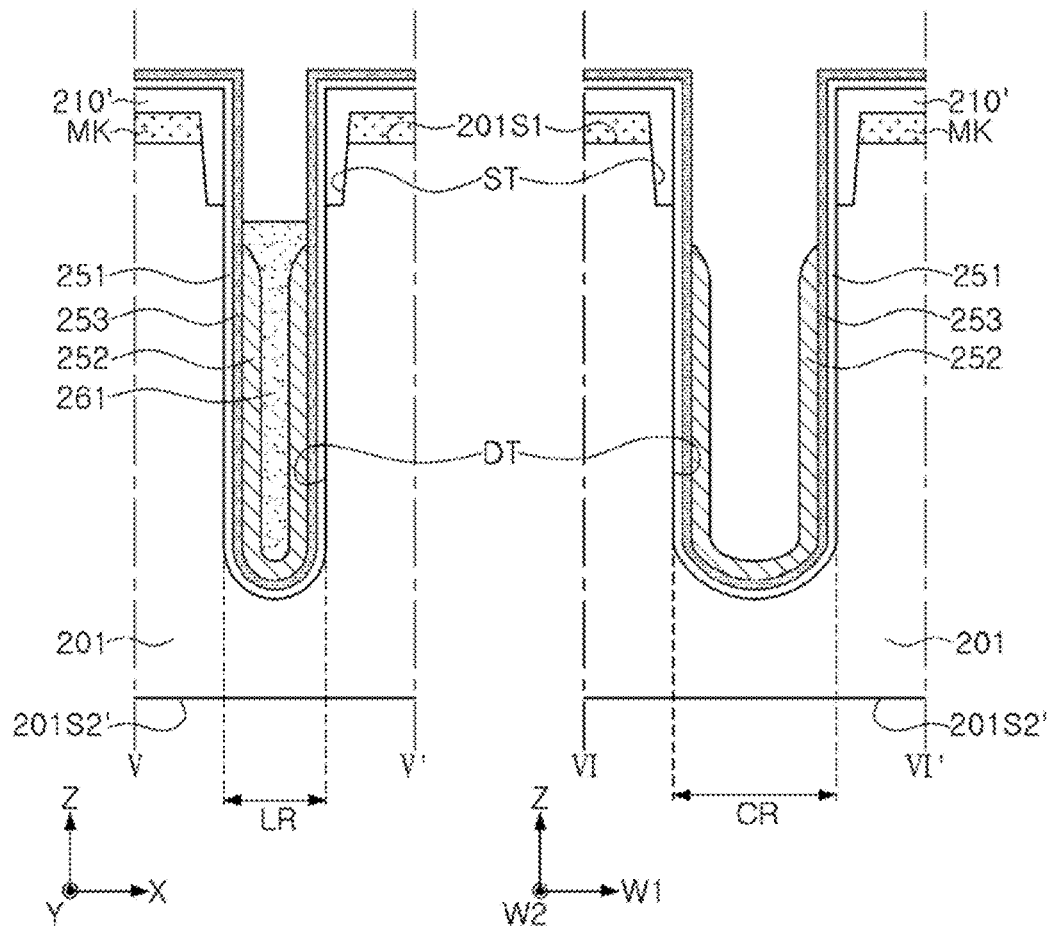

Referring to FIGS. 7 and 9C, the first gap-fill patterns 261 may be formed in the line regions LR by etching the first gap-fill material layer 261', and the second isolation layer 252 may be exposed in the cross regions CR (S40).

The first gap-fill material layer 261' may be partially removed from an upper portion in the line regions LR such that an upper end thereof may be formed on a lower level than a level of the first surface 201S1 of the second substrate 201, such as, for example, a level lower than a level of a lower end of the shallow isolation trench ST. The first gap-fill material layer 261' may be etched and may be formed as first gap-fill patterns 261 in the line regions LR. A portion of the first gap-fill material layer 261' covering the second isolation layer 252 may be removed in the cross regions CR and the second isolation layer 252 may be exposed.

Figure 9D:
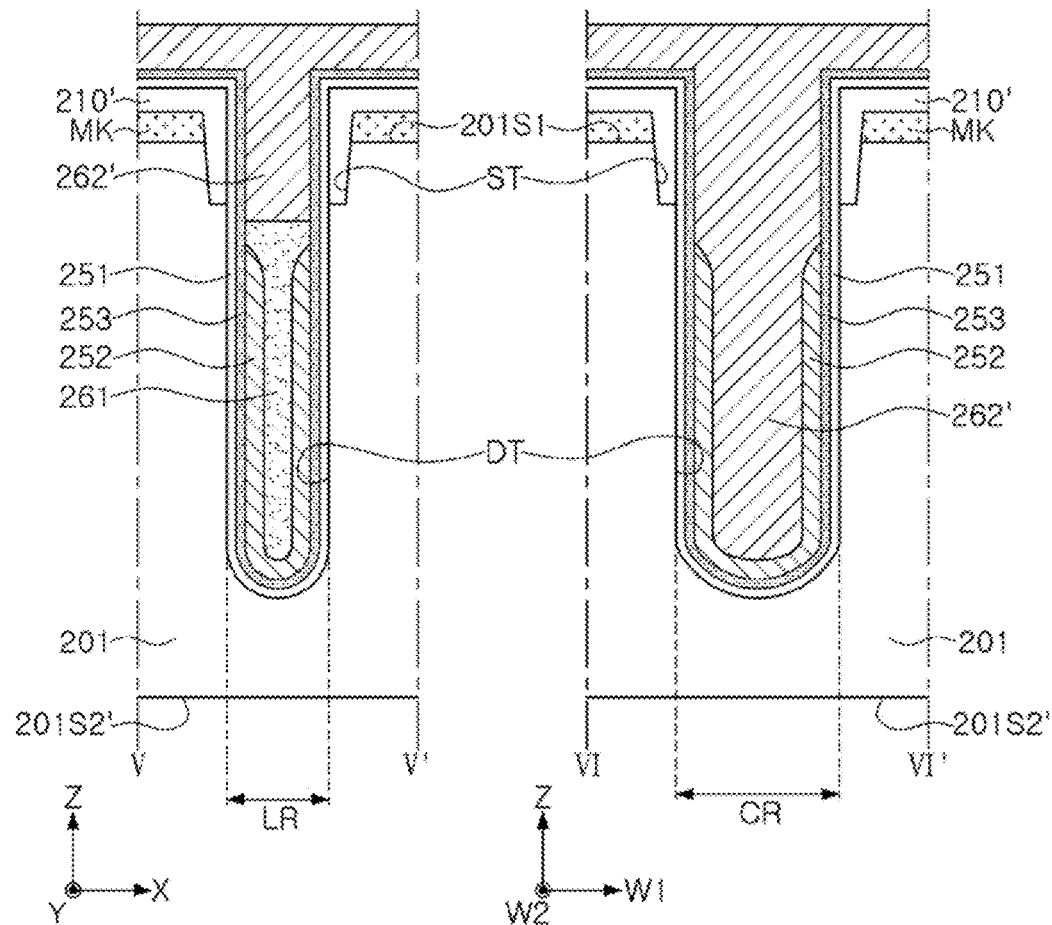

Referring to FIGS. 7 and 9D, a second gap-fill material layer 262' filling the isolation trench DT in the cross regions CR may be formed (S50).

The second gap-fill material layer 262' may be formed to be in contact with the second isolation layer 252 in the cross regions CR and to at least partially fill the isolation trench DT. The second gap-fill material layer 262' may be deposited on the first surface 201S1 of the second substrate 201, and may partially cover the first gap-fill pattern 261 in the line regions LR.

Figure 9E:
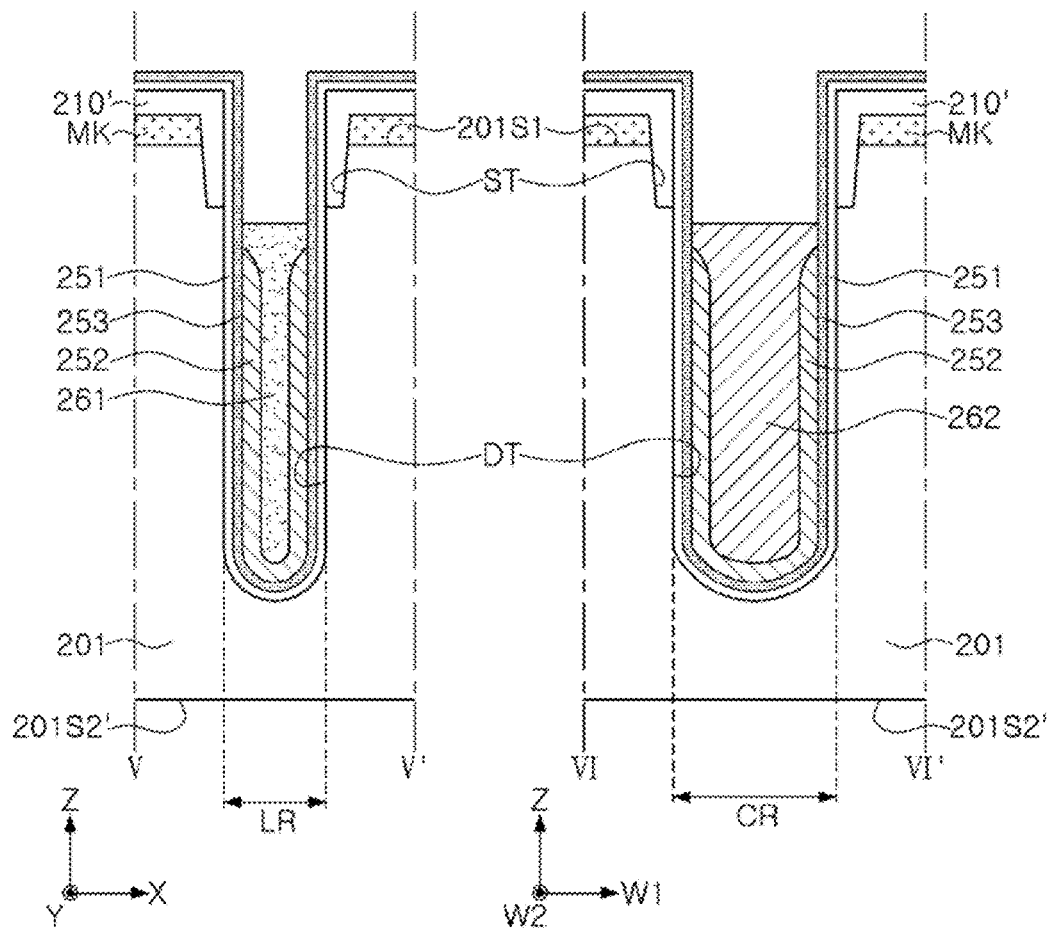

Referring to FIGS. 7 and 9E, second gap-fill patterns 262 may be in the cross regions CR by etching the second gap-fill material layer 262' (S60).

The second gap-fill material layer 262' may be partially removed from an upper portion in the cross regions CR such that an upper end thereof may be disposed on a level lower than the first surface 201S1 of the second substrate 201, that is, for example, on a level lower than a level of a lower end of the shallow isolation trench ST. The second gap-fill material layer 262' may be etched and may be formed as second gap-fill patterns 262 in the cross regions CR. The second gap-fill patterns 262 may be spaced apart from each other by the first gap-fill patterns 261 disposed in the line regions LR and may be locally disposed only in the cross regions CR. The upper ends of the second gap-fill patterns 262 may be formed on substantially the same level as a level of the lower end of the shallow isolation trench ST. As the second gap-fill patterns 262 are formed, a portion of the second gap-fill material layer 262' covering a portion of the first gap-fill pattern 261 in the line regions LR may also be removed.

Figure 9F:
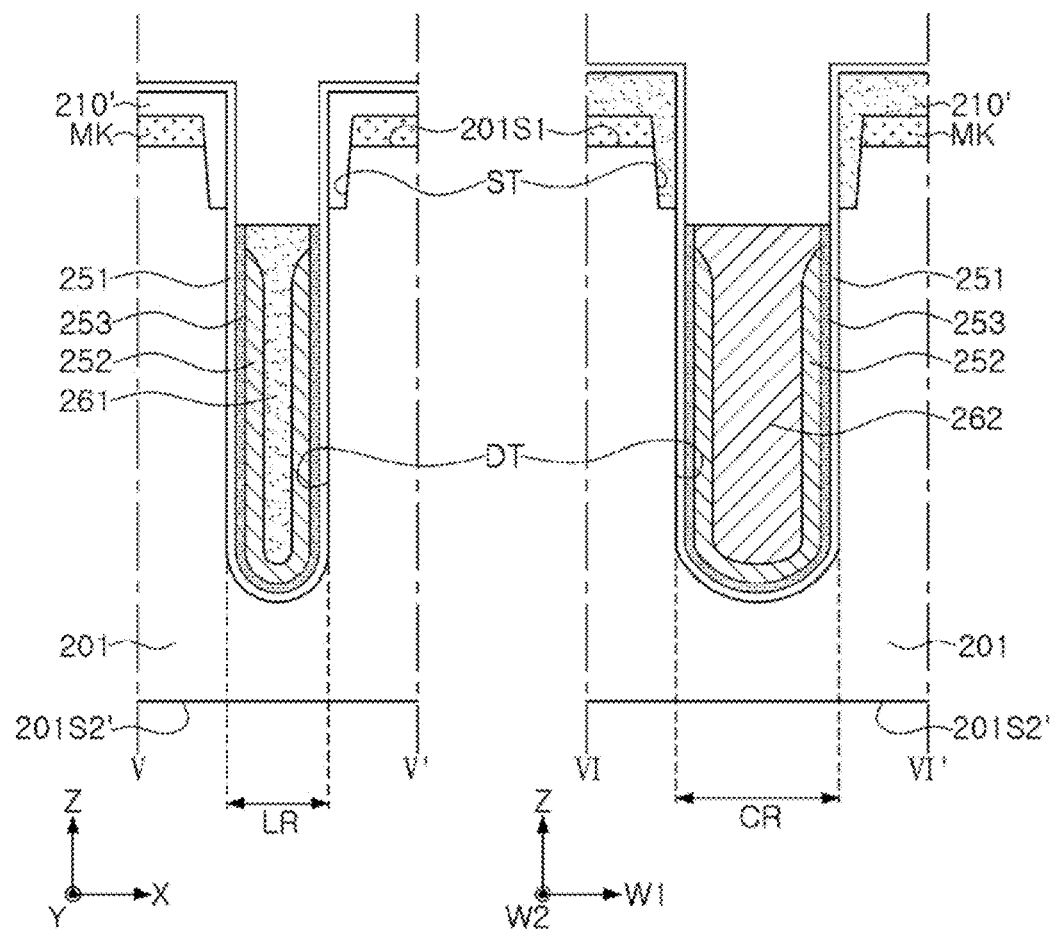

Referring to FIGS. 7 and 9F, the liner layer 253 may be partially removed (S70).

The liner layer 253 exposed on the first gap-fill patterns 261 and the second gap-fill patterns 262 may be selectively removed with respect to the first gap-fill patterns 261 and the second gap-fill patterns 262. By removing the liner layer 253, the first isolation layer 251 on the second substrate 201 may be exposed. When the liner layer 253 is not formed in process S20, this process may not be performed.

Figure 9G:
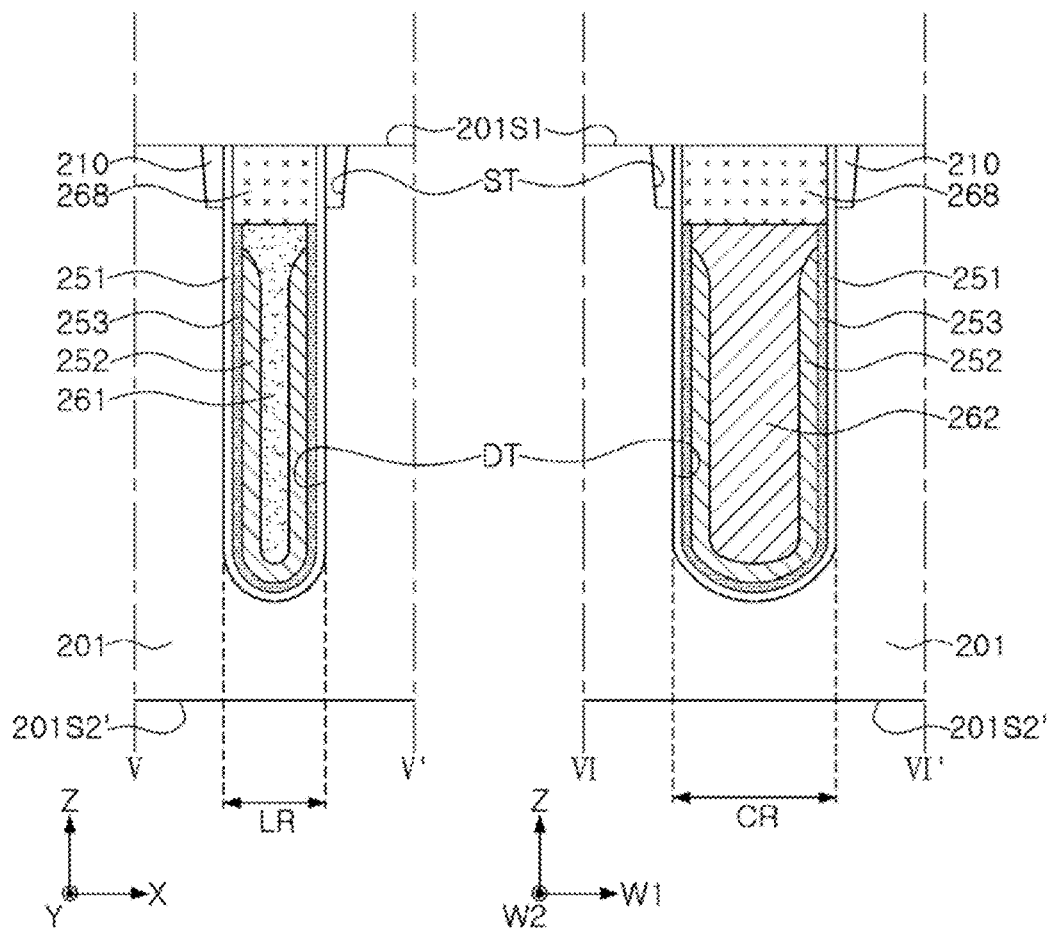

Referring to FIGS. 7 and 9G, a capping layer 268 may be formed on the first gap-fill patterns 261 and the second gap-fill patterns 262 (S80).

A capping layer 268 covering the first gap-fill patterns 261 and the second gap-fill patterns 262 and in contact with an internal surface of the first isolation layers 251 may be formed. The capping layer 268 may fill an upper region of the isolation trench DT. The capping layer 268 may be formed by depositing an insulating layer on the second substrate 201 and performing a planarization process. When the planarization process is performed, a portion of the device isolation layer 210' on the first surface 201S1 of the second substrate 201 may be removed such that the second device isolation layer 210 filling the shallow isolation trench ST may be formed. In an example, the mask pattern MK may be removed after the planarization process is performed, thereby reducing or preventing damages to the first surface 201S of the second substrate 201.

Figure 10A:
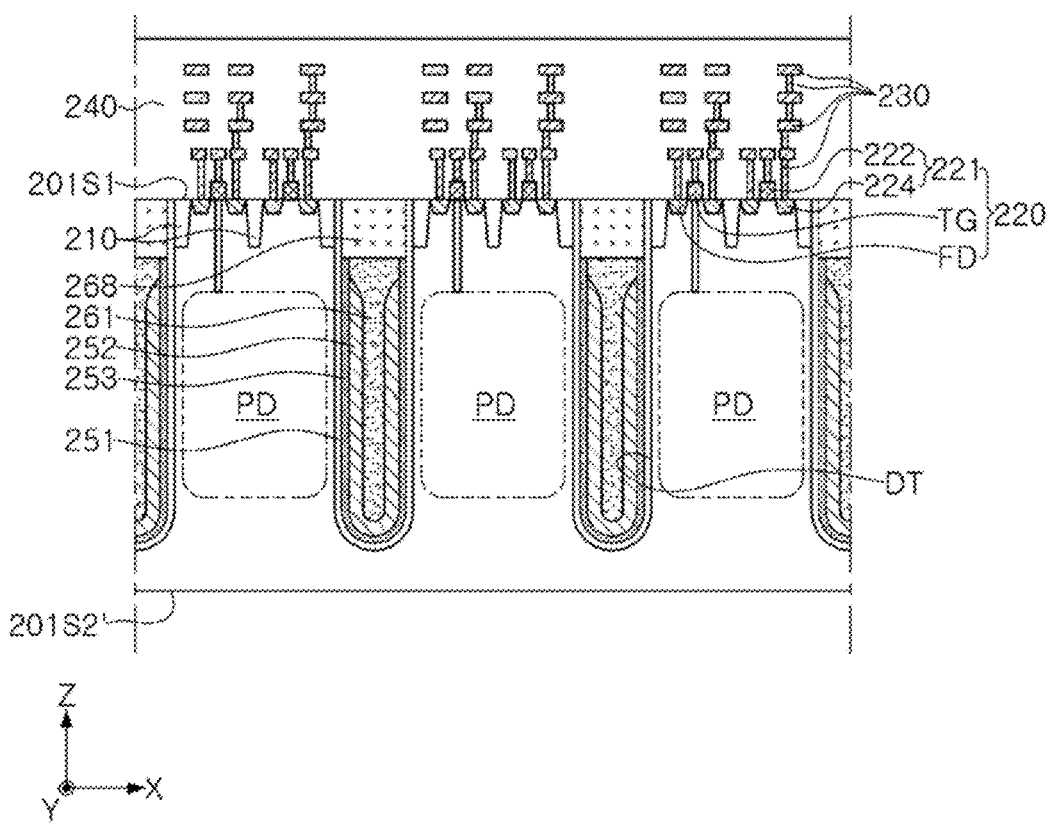
FIGS. 10A, 10B, 11A, and 11B are diagrams illustrating processes of a method of manufacturing an image sensor in order according to some example embodiments of the present inventive concepts.
Figure 10B:
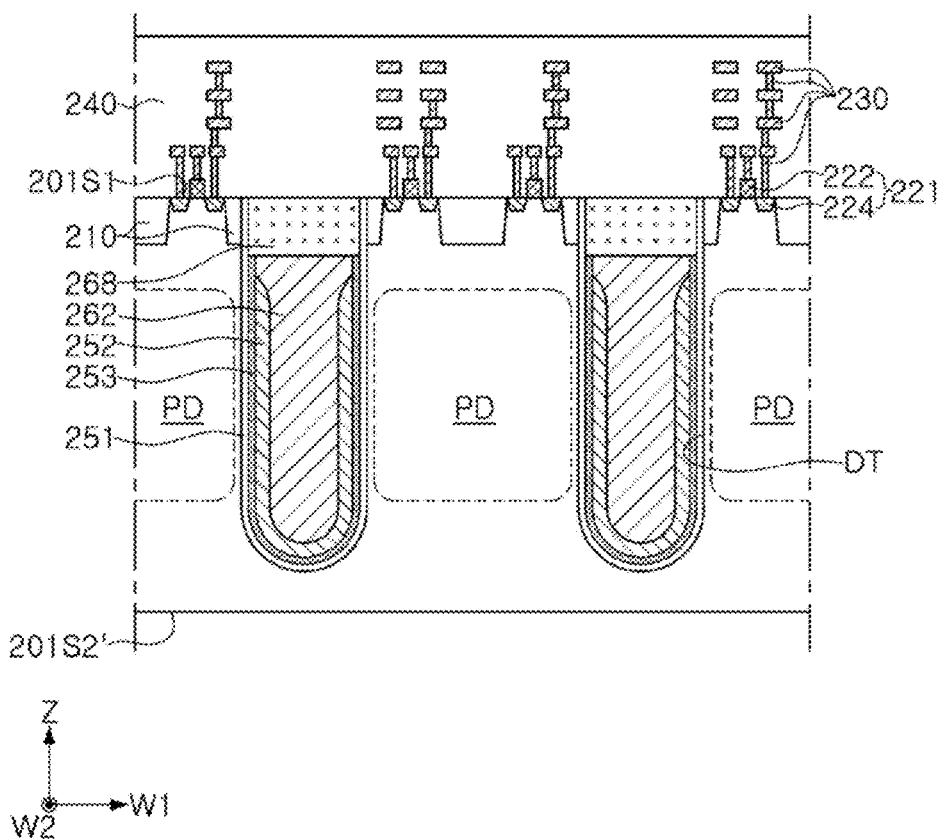

Thereafter, referring to FIGS. 10A and 10B, photoelectric conversion device regions PD may be formed by doping the semiconductor patterns 201P with impurities, and a transfer gate TG, a second circuit device 220 including a floating diffusion region FD and circuit transistors 221, a second wiring structure 230, and a second insulating layer 240 may be formed on the first surface 201S of the second substrate 201. Specifically, the forming the second circuit device 220 may include forming the transfer gate TG and the gate 222 on the active region defined by the second device isolation layer 210, and forming a floating diffusion region FD and a source/drain 224 by doping the active region with impurities. A plurality of layers forming the second insulating layer 240 may be formed on the first surface 201S1 of the second substrate 201 and the second wiring structure 230 may be formed in the second insulating layer 240.

Figure 11A:
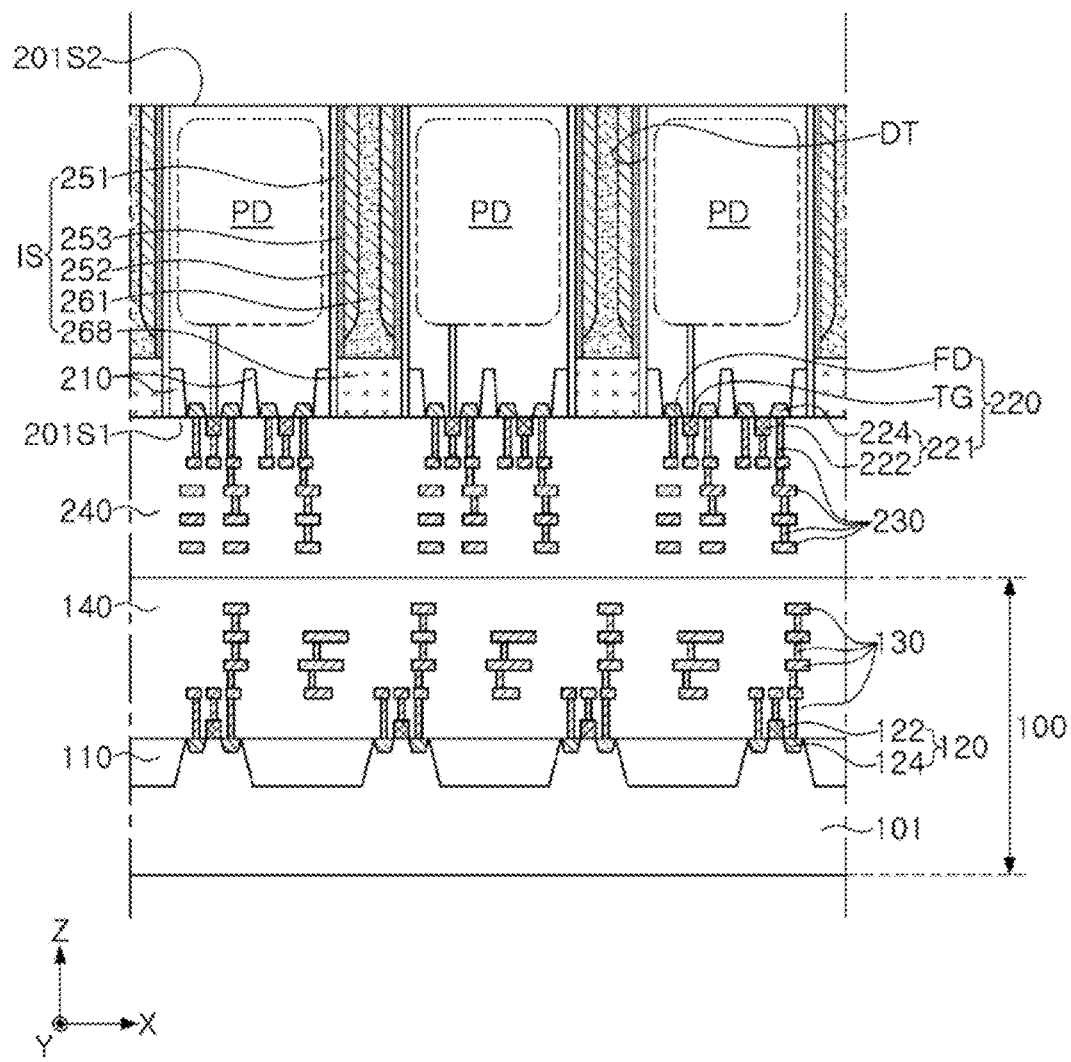
Figure 11B:
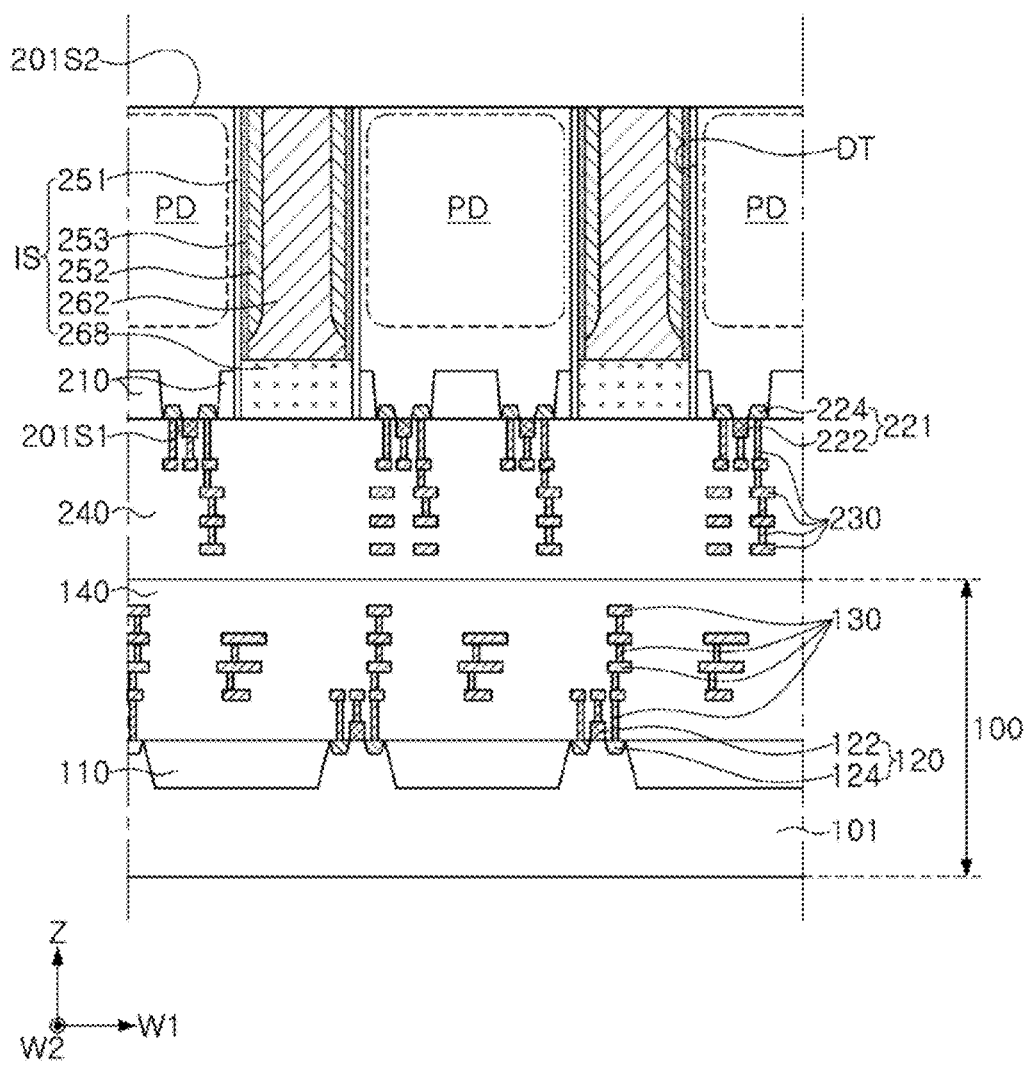

Referring to FIGS. 11A and 11B, a first chip structure 100 including a first substrate 101, a first device isolation layer 110, a first circuit device 120, a first wiring structure 130, and a first insulating layer 140 may be prepared, and the substrate structure in FIGS. 10A and 10B may be turned upside down and may be bonded to the first chip structure 100. The first insulating layer 140 and the second insulating layer 240 may be in direct contact with and bonded to each other.

A vertical thickness of the second substrate 201 may be reduced by removing a portion of the second substrate 201. The second substrate 201 may include grinding or polishing the second surface 201S2' opposing the first surface 201S1, and anisotropic and isotropic etching the second surface 201S2'. Accordingly, each of the first isolation layer 251, the second isolation layer 252, the liner layer 253, the first gap-fill pattern 261, and the second gap-fill pattern 262 may be partially removed and the surfaces thereof may be removed. Accordingly, the isolation structure IS penetrating through the second substrate 201 may be formed.

Referring back to FIGS. 2A and 2B, an insulating structure 270, color filters 280, and microlenses 290 may be formed on the second surface 201S2 of the second substrate 201, thereby forming the second chip structure 200. Accordingly, the image sensor 1000 including the first chip structure 100 and the second chip structure 200 on the first chip structure 100 may be manufactured.

Figure 12:
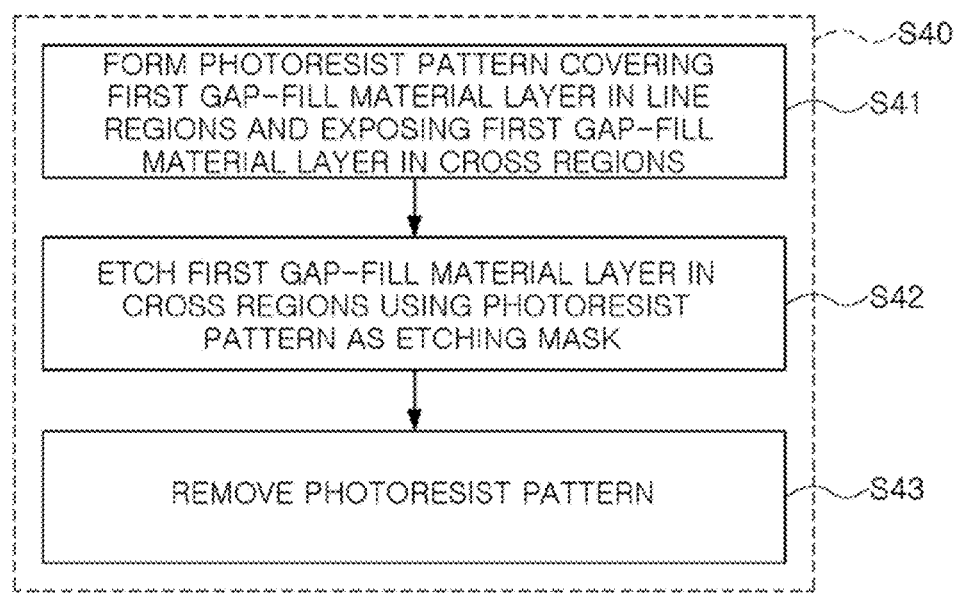
FIG. 12 is a flowchart illustrating processes of a method of manufacturing an image sensor in order according to some example embodiments of the present inventive concepts.

FIG. 12 is a flowchart illustrating processes of a method of manufacturing an image sensor in order according to some example embodiments. FIG. 12 is a flowchart illustrating another example of a method of etching the first gap-fill material layer 261' to expose the second isolation layer 252 in the cross regions CR.

Figure 13A:
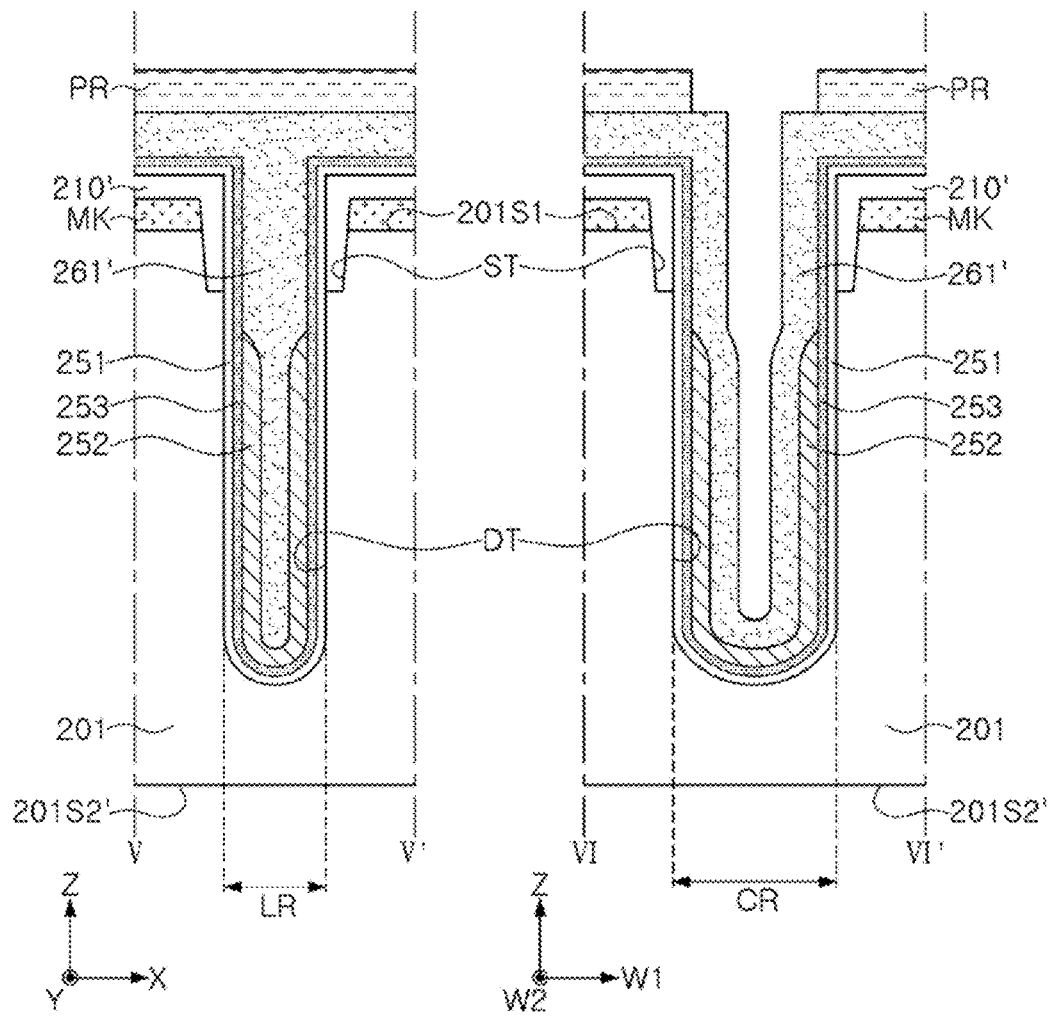
FIGS. 13A, 13B, and 13C are diagrams illustrating processes of a method of manufacturing an image sensor in order according to some example embodiments of the present inventive concepts.
Figure 13B:
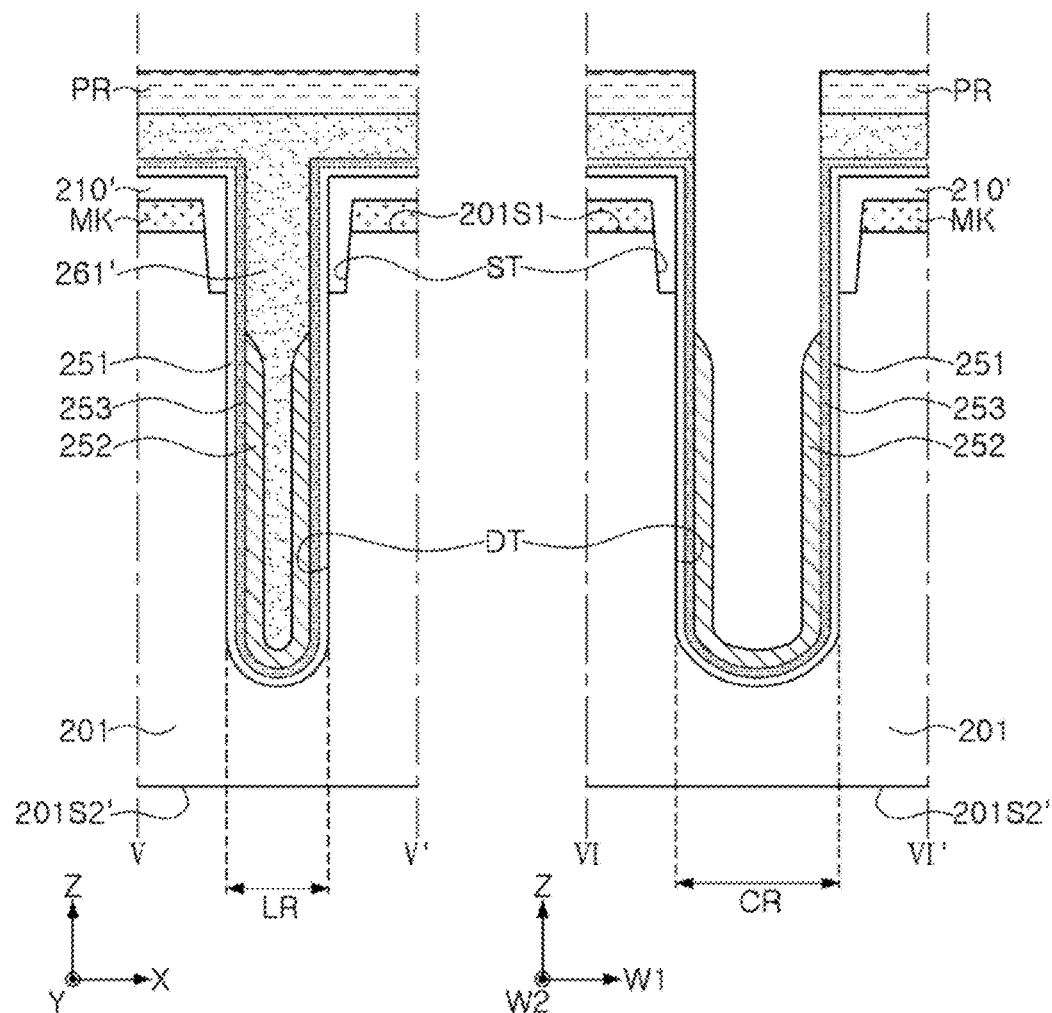
Figure 13C:
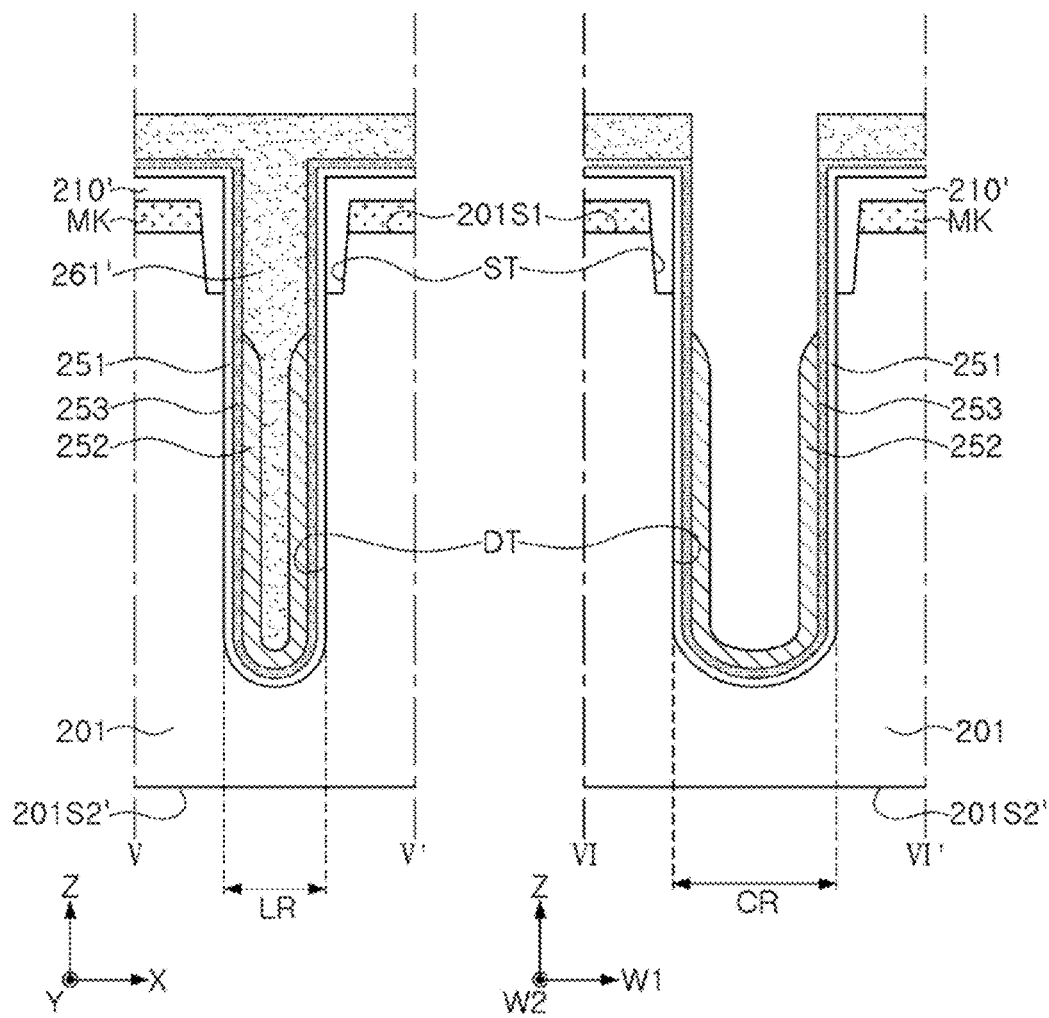

FIGS. 13A, 13B, and 13C are diagrams illustrating processes of a method of manufacturing an image sensor in order according to some example embodiments. FIGS. 13A to 13C illustrate cross-sectional regions of the substrate in FIG. 8 taken along line V-V' and VI-VI'.

Referring to FIGS. 12 to 13C, exposing the second isolation layer 252 in the cross regions CR (S40) may include forming a photoresist pattern PR covering the first gap-fill material layer 261' in the line regions LR and exposing the first gap-fill material layer 261' in the cross regions CR (S41), etching the first gap-fill material layer 261' in the cross regions CR using the photoresist pattern PR as an etch mask (S42), and removing the photoresist pattern PR (S43).

Referring to FIG. 13A, a photoresist may be formed on the first gap-fill material layer 261', and a photolithography process may be performed such that the photoresist may be opened to expose the first gap-fill material layer 261' in the cross regions CR, thereby forming the photoresist pattern PR.

Thereafter, referring to FIG. 13B, an etching process may be performed such that the first gap-fill material layer 261' may be removed from the cross regions CR through the open region of the photoresist pattern PR. The first gap-fill material layer 261' may not remain in the isolation trench DT in the cross regions CR. Accordingly, the second isolation layer 252 may be exposed.

Thereafter, referring to FIG. 13C, the photoresist pattern PR may be removed by performing a stripping process and an ashing process. The other processes of the manufacturing the image sensor may be the same as the processes described with reference to FIGS. 7 to 11B.

According to at least some of the aforementioned example embodiments, by disposing the first gap-fill patterns in the line regions of the isolation trench and disposing the second gap-fill patterns in the cross regions of the isolation trench, an image sensor having improved optical property efficiency and improved sensitivity and a method of manufacturing the same may be provided.

While some example embodiments have been illustrated and described above, it will be apparent to those skilled in the art that modifications and variations could be made without departing from the scope of the present inventive concepts as defined by the appended claims.

What is claimed is:

1. An image sensor, comprising:
   a first chip structure including a first substrate and first circuit devices on the first substrate; and
   a second chip structure on the first chip structure,
   wherein the second chip structure includes
   a second substrate having a first surface facing the first chip structure and a second surface opposing the first surface,
   second circuit devices on the first surface of the second substrate,
   anti-reflective layers on the second surface of the second substrate,
   color filters on the anti-reflective layers,
   microlenses on the color filters,
   an isolation structure in the second substrate, and
   photoelectric conversion device regions spaced apart from each other by the isolation structure in the second substrate,
   wherein the isolation structure has first regions adjacent to side surfaces of the photoelectric conversion device regions and second regions adjacent to each corner of the photoelectric conversion device regions,
   wherein the isolation structure includes
   first isolation layers surrounding the photoelectric conversion device regions, respectively,
   second isolation layers surrounding the first isolation layers,
   first gap-fill patterns filling at least a portion of a space between the second isolation layers in the first regions, and
   second gap-fill patterns filling at least a portion of a space between the second isolation layers in the second regions, in a plan view, and
   wherein the second gap-fill patterns are in contact with the first gap-fill patterns, in the plan view.

2. The image sensor of claim 1, wherein
   the second gap-fill patterns include concave regions facing a portion of each corner of the photoelectric conversion device regions, and
   the concave regions of the second gap-fill patterns are in contact with the second isolation layers.

3. The image sensor of claim 1, wherein the second gap-fill patterns are spaced apart from each other in the plan view.

4. The image sensor of claim 1, wherein
   an end portion of each of the second gap-fill patterns extends to a region between opposing side surfaces of the side surfaces of the photoelectric conversion device regions, and
   an end surface of each of the second gap-fill patterns has a shape that is curved toward the first gap-fill patterns.

5. The image sensor of claim 1, wherein the isolation structure further includes liner layers between the first isolation layers and the second isolation layers.

6. The image sensor of claim 1, wherein the isolation structure further includes a capping layer in contact with an internal surface of the first isolation layers and covering the first gap-fill patterns and the second gap-fill patterns.

7. The image sensor of claim 1, further comprising:
a device isolation layer defining an active region on the first surface of the second substrate,
wherein the isolation structure penetrates the device isolation layer.

8. An image sensor, comprising:
photoelectric conversion device regions in a substrate; and
an isolation structure extending in a direction from a first surface of the substrate to a second surface opposing the first surface, surrounding the photoelectric conversion device regions in a plan view, and having first regions adjacent to side surfaces of the photoelectric conversion device regions and second regions adjacent to each corner of the photoelectric conversion device regions,
wherein the isolation structure includes
first isolation layers surrounding the photoelectric conversion device regions, respectively,
second isolation layers surrounding the first isolation layers,
first gap-fill patterns filling at least a portion of a space between the second isolation layers in the first regions, and
second gap-fill patterns filling at least a portion of a space between the second isolation layers in the second regions, in the plan view.

9. The image sensor of claim 8, wherein
the first gap-fill patterns are between photoelectric conversion device regions that are adjacent to each other in a first direction among the photoelectric conversion device regions in the plan view, and
the second gap-fill patterns are between photoelectric conversion device regions that are adjacent to each other in a second direction oblique to the first direction among the photoelectric conversion device regions in the plan view.

10. The image sensor of claim 8, wherein the second gap-fill patterns are in contact with the first gap-fill patterns.

11. The image sensor of claim 8, wherein the second gap-fill patterns are adjacent to each corner of the photoelectric conversion device regions, and are spaced apart from each other by the first gap-fill patterns.

12. The image sensor of claim 8, wherein
the isolation structure forms a grid pattern in the plan view, and
the second regions are intersecting regions of the grid pattern.

13. The image sensor of claim 8, wherein the second gap-fill patterns each have a cross shape in the plan view.

14. The image sensor of claim 8, wherein side surfaces of the second gap-fill patterns in contact with the first gap-fill patterns have a shape that is curved toward the first gap-fill patterns.

15. The image sensor of claim 8, wherein
the isolation structure further includes liner layers between the first isolation layers and the second isolation layers, and
the liner layers include a material different from a material of the first isolation layers and the second isolation layers.

16. The image sensor of claim 8, wherein the second gap-fill patterns include a material different from a material of the first gap-fill patterns.

17. An image sensor, comprising:
a photoelectric conversion device region in a substrate; and
isolation structure extending in a direction from a first surface of the substrate to a second surface opposing the first surface, and surrounding the photoelectric conversion device region,
wherein the isolation structure includes
a first isolation layer surrounding the photoelectric conversion device region,
a second isolation layer surrounding the first isolation layer,
first gap-fill patterns in contact with the second isolation layer, and
second gap-fill patterns in contact with the second isolation layer in a region adjacent to each corner of the photoelectric conversion device region, in a plan view, and
wherein the second gap-fill patterns are spaced apart from each other by the first gap-fill patterns.

18. The image sensor of claim 17, wherein the first gap-fill patterns are between the second gap-fill patterns.

19. The image sensor of claim 17, wherein
the first gap-fill patterns have a first minimum width in a first direction perpendicular to a side surface of the photoelectric conversion device region,
the second gap-fill patterns have a second minimum width in a second direction oblique to the first direction and parallel to an upper surface of the substrate, and
the first minimum width is smaller than the second minimum width.

20. The image sensor of claim 19, wherein the second minimum width is from about 1.3 times the first minimum width to about 4 times the first minimum width.

* * * * *